(12) United States Patent  (10) Patent No.: US 9,230,894 B2
Fuergut et al.  (45) Date of Patent: Jan. 5, 2016

(54) METHODS FOR MANUFACTURING A CHIP PACKAGE

(75) Inventors: Edward Fuergut, Dasing (DE); Irmgard Escher-Poeppel, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 13/461,859

(22) Filed: May 2, 2012

(65) Prior Publication Data

US 2013/0295720 A1  Nov. 7, 2013

(51) Int. Cl.
*H01L 23/498* (2006.01)
*H01L 23/31* (2006.01)
*H01L 21/56* (2006.01)
*H01L 23/00* (2006.01)
*H01L 23/538* (2006.01)

(52) U.S. Cl.
CPC ........ *H01L 23/49805* (2013.01); *H01L 21/561* (2013.01); *H01L 21/565* (2013.01); *H01L 21/568* (2013.01); *H01L 23/3107* (2013.01); *H01L 23/3114* (2013.01); *H01L 23/5389* (2013.01); *H01L 24/24* (2013.01); *H01L 24/25* (2013.01); *H01L 24/96* (2013.01); *H01L 24/97* (2013.01); *H01L 23/3171* (2013.01); *H01L 24/19* (2013.01); *H01L 24/82* (2013.01); *H01L 2224/04105* (2013.01); *H01L 2224/2518* (2013.01); *H01L 2224/82* (2013.01); *H01L 2224/96* (2013.01); *H01L 2924/12032* (2013.01); *H01L 2924/1301* (2013.01); *H01L 2924/1305* (2013.01); *H01L 2924/1306* (2013.01); *H01L 2924/13034* (2013.01); *H01L 2924/13091* (2013.01); *H01L 2924/1815* (2013.01)

(58) Field of Classification Search
USPC .................................................. 438/106, 107
See application file for complete search history.

(56) References Cited

U.S. PATENT DOCUMENTS

| | | | |
|---|---|---|---|
| 7,559,826 B2 | 7/2009 | Sekiya | |
| 2007/0020887 A1* | 1/2007 | Sekiya | 438/459 |
| 2008/0224296 A1 | 9/2008 | Meyer et al. | |
| 2009/0017623 A1* | 1/2009 | Kajiyama et al. | 438/675 |
| 2010/0233831 A1* | 9/2010 | Pohl et al. | 438/15 |
| 2011/0291117 A1* | 12/2011 | Kwack et al. | 257/88 |
| 2011/0291301 A1 | 12/2011 | Bruendel et al. | |
| 2012/0040497 A1* | 2/2012 | Chandrasekaran | 438/107 |

OTHER PUBLICATIONS

Office Action in the corresponding German application No. 10 2013 104 48T5 mailed on Aug. 15, 2014. (for information only).

* cited by examiner

*Primary Examiner* — Cherles Garber
*Assistant Examiner* — Brigitte Paterson

(57) ABSTRACT

A method for manufacturing a chip package is provided. The method including: arranging a plurality of dies over a carrier; depositing encapsulation material over the carrier wherein the plurality of dies are covered by the encapsulation material thereby forming a structure including the encapsulation material and the plurality of dies; and removing encapsulation material thereby forming a thinned portion of the structure and a further portion of the structure including encapsulation material thicker than the thinned portion.

27 Claims, 15 Drawing Sheets

FIG 1    ~ 100

- arranging a plurality of dies over a carrier; ~ 110
- depositing encapsulation material over the carrier wherein the plurality of dies are covered by the encapsulation material thereby forming a structure including the encapsulation material and the plurality of dies; ~ 120
- and removing encapsulation material thereby forming a thinned portion of the structure and a further portion of the structure including encapsulation material thicker than the thinned portion. ~ 130

FIG 4A
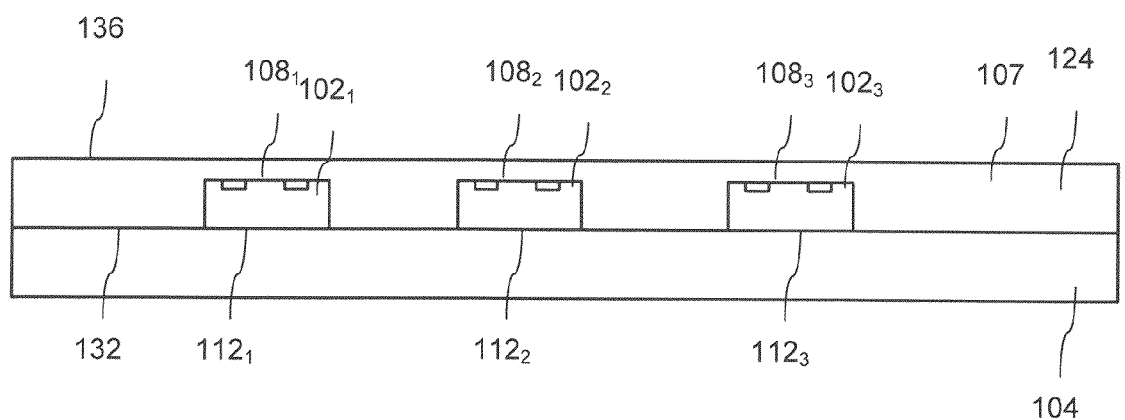
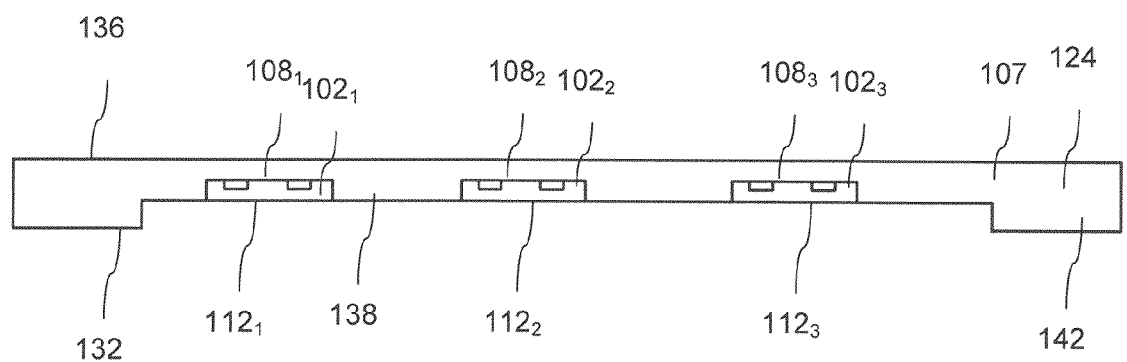

FIG 4B
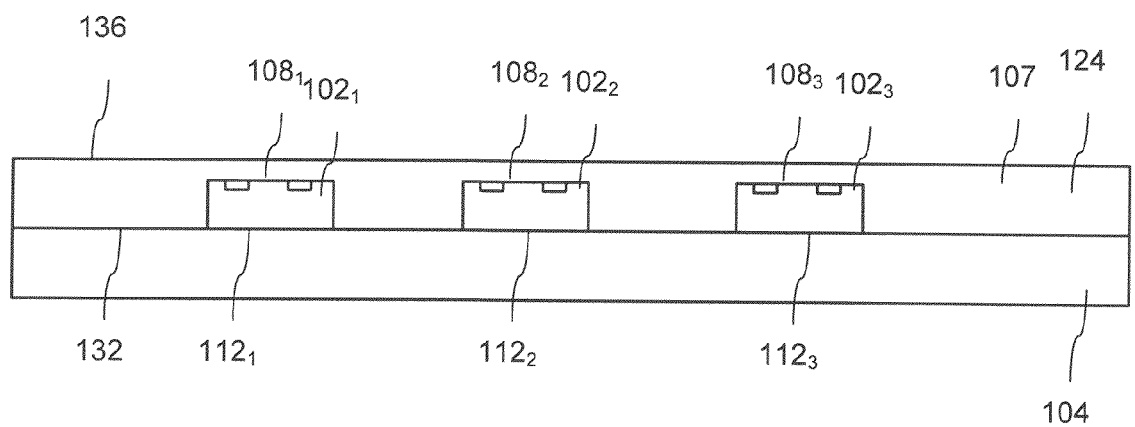
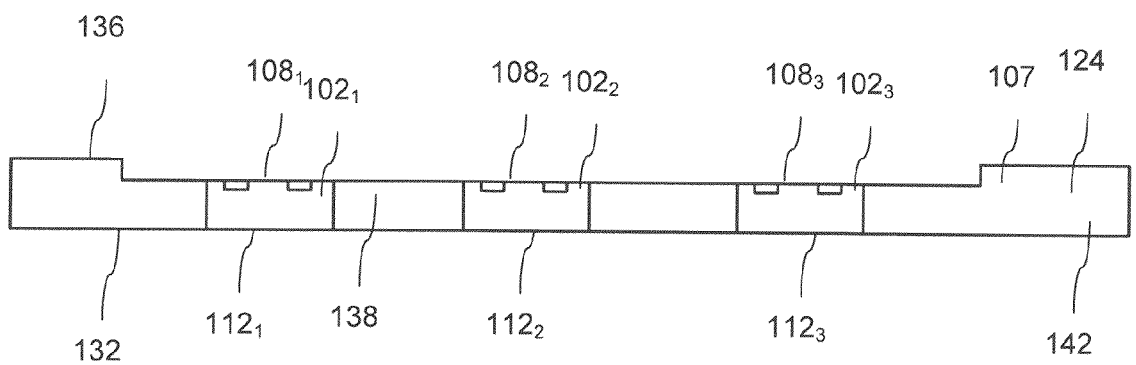

FIG 4C
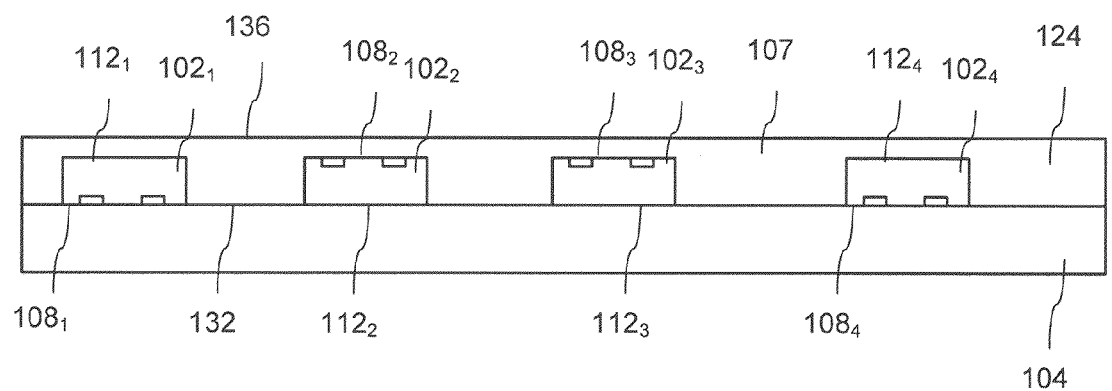
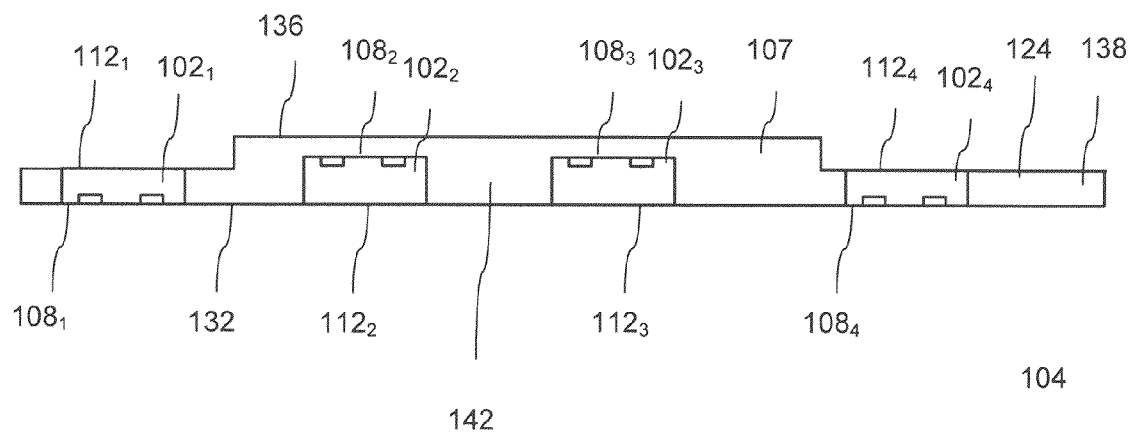

FIG 4D
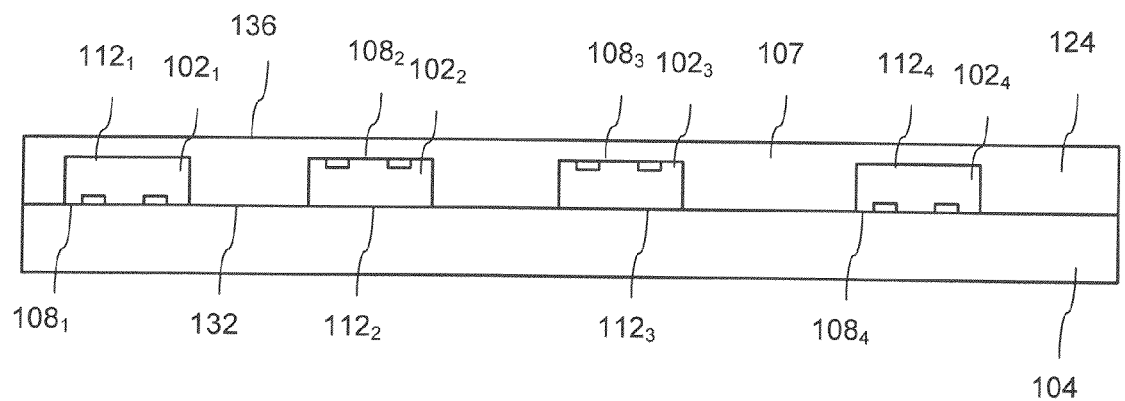
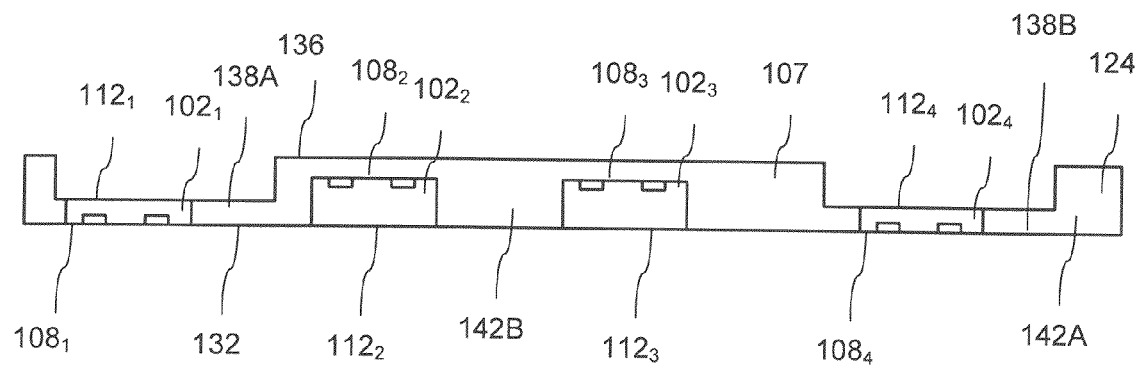

FIG 6 arranging a plurality of dies over a carrier; — 610 depositing encapsulation material over the carrier wherein the plurality of dies are covered by the encapsulation material thereby forming a structure including the encapsulation material and the plurality of dies; — 620 and forming one or more electrical interconnects over a first side of the plurality of dies before thinning the encapsulation material and the plurality of dies from a second side of the structure opposite to the first side of the plurality of dies. — 630

METHODS FOR MANUFACTURING A CHIP PACKAGE

TECHNICAL FIELD

Various embodiments relate generally to methods for manufacturing a chip package.

BACKGROUND

Very thin chips, e.g. chips having a thickness of less than 100 µm are challenging to handle due to their size. Presently, electronic circuits are manufactured at wafer level, e.g. front end processes may be carried out on a wafer. The wafer which may have at least a specified thickness, and depending on diameter, may be handled with a costly carrier system. Following which, thinning may be carried out and solder material may be provided on the wafer backside. Presently, during production of electronic components, e.g. power electronics, thin chips may be provided with back side metallization and may require a special sawing process.

The thin chips, with backside metallization must be singulated, e.g. individualized. The thin chips may be subsequently placed on an interposer in a serial pick and place process, and soldered under high pressure and temperature. The thin chips may be soldered onto the interposer with inert gas at extremely high temperatures, e.g. temperatures greater than 300° C. Soldering very thin chips therefore places limits on through-put and places high stress, e.g. high pressure and high temperatures, on the thin chips.

Current methods, e.g. current production and/or manufacturing methods introduce a large expenditure into the chip handling and place limits on the size of the carrier due to bending and/or deflection, as wafers become thinner. The carrier system may limit the processing temperature of further back side processing such as soldering, curing or any other re-flow processes. The thin wafers, e.g. thin silicon wafers must be sawed with thick metal on the back side. Furthermore, thin chips need to be picked from the sawing foil and using an ultra violet UV foil may be necessary. High costs and yield loss may be incurred through the processing of thin wafers and chips, e.g. back side metallization, sawing, die bonding, etc from extremely thin wafers and chips.

SUMMARY

Various embodiments provide a method for manufacturing a chip package, the method including: arranging a plurality of dies over a carrier; depositing encapsulation material over the carrier wherein the plurality of dies are covered by the encapsulation material thereby forming a structure including the encapsulation material and the plurality of dies; and removing encapsulation material thereby forming a thinned portion of the structure and a further portion of the structure including encapsulation material thicker than the thinned portion.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method for manufacturing a chip package according to an embodiment;

FIGS. 4A to 4D show methods for manufacturing a chip package according to various embodiments;

FIG. 6 shows a method for manufacturing a chip package according to an embodiment.

DESCRIPTION

Figure 2A:
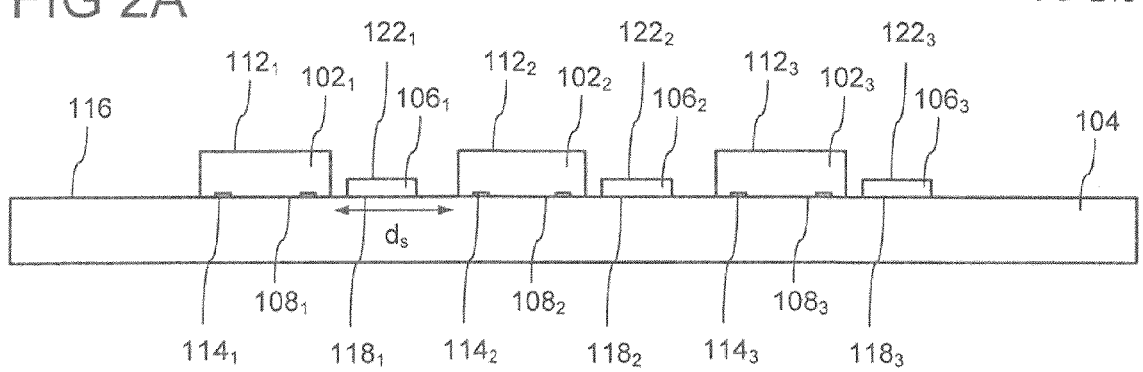
FIGS. 2A to 2I show a method for manufacturing a chip package according to an embodiment.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a method for manufacturing a chip package for ultra thin (less than 100 µm thick) chips, for thinning chips, e.g. power semiconductors within a housing and constructing the interconnects through galvanic methods.

Various embodiments provide a method for manufacturing a chip package which avoids the individual handling of ultra-thin chips, and instead thinning chips at wafer level when the chips are realized in encapsulation material.

Various embodiments provide a method for manufacturing a chip package, wherein chips and packages, i.e. packaging materials may be thinned and at the same time the necessary stiffness of the wafer level package carrier, e.g. encapsulation material, may be maintained.

FIG. 1 shows method 100 for manufacturing a chip package according to an embodiment. Method 100 may include:

arranging a plurality of dies over a carrier (in 110);

depositing encapsulation material over the carrier wherein the plurality of dies are covered by the encapsulation material thereby forming a structure including the encapsulation material and the plurality of dies (in 120); and removing encapsulation material thereby forming a thinned portion of the structure and a further portion of the structure including encapsulation material thicker than the thinned portion. (in 130).

FIGS. 2A to 2I show method 200 for manufacturing a chip package according to an embodiment. Method 200 may include one or more or all of the processes already described with respect to Method 100.

A semiconductor wafer may include many semiconductor dies formed in the semiconductor wafer. Each of the dies may include a chip, e.g. a semiconductor chip. The semiconductor chip may include at least part of a wafer substrate, wherein the wafer substrate may include a material, e.g. a semiconductor material.

The wafer substrate may include at least one from the following group of materials, the group of materials consisting of: Silicon, Germanium, Group III to V materials, polymers. According to an embodiment, the wafer substrate may include doped or undoped silicon. According to another embodiment, the wafer substrate may include a silicon on insulator (SOI) wafer. According to an embodiment, the wafer substrate may include a semiconductor compound material, e.g. gallium arsenide (GaAs), indium phosphide (InP). According to an embodiment, the wafer substrate may include a quaternary semiconductor compound material, e.g. indium gallium arsenide (InGaAs).

The wafer substrate may have a thickness, (from top side to bottom side) ranging from about 250 µm to about 950 µm, e.g. from about 300 µm to about 750 µm, e.g. from about 400 µm to about 650 µm. The wafer may have a diameter ranging from about 25 mm to about 450 mm, e.g. about 100 mm, to about 350 mm, e.g. about 200 mm to about 300 mm.

One or more electronic circuits may be formed within the dies in a front end process, e.g. over a front side of the semiconductor wafer. The front end process may include a front end of line FEOL process, wherein at least one process may be carried out to form the active electrical components of the semiconductor device, e.g. forming a source region, e.g. forming a drain region, e.g. forming a channel region. An FEOL process may be followed by a back end of line BEOL process, wherein metallization, e.g. wiring, may be formed to electrically connect the active electrical components of the semiconductor device.

Following front end processes, the dies, which still form part of the semiconductor wafer, may undergo wafer testing. The dies within the wafer may then undergo a singulation, e.g. a separation process to individualize the dies from each other, e.g. by undergoing a dicing process. As a result of the individualization process, good dies, i.e. dies which may pass the wafer test, may be separated from bad dies, i.e. dies which fail the wafer test.

In 210, plurality of dies $102_1, 102_2, 102_3 \ldots 102_n$ (which generally include, but are not limited to include good dies which pass the wafer test) may be disposed over carrier 104, e.g. over side 116 of carrier 104.

This process may be carried out using a "pick and place" process. It may be understood that at this part of the process, the dies may have a thickness (from top side to bottom side) ranging from about 250 µm to about 950 µm, e.g. from about 300 µm to about 750 µm, e.g. from about 400 µm to about 650 µm. The singulation process may result in individual dies, wherein each die may have a length ranging from about 100 µm to 10 mm, e.g. about 200 µm to 8 mm, e.g. about 500 µm to about 5 mm, and wherein each die may have a breadth ranging from about 100 µm to 10 mm, e.g. about 200 µm to 8 mm, e.g. about 500 µm to about 5 mm.

The individualization occurs with unthinned chips. Further component production may be realized in an encapsulation material, e.g. a plastic mold in subsequent processes.

Three dies $102_1, 102_2, 102_3$ are shown FIG. 2A, however, plurality of dies $102_1, 102_2, 102_3 \ldots 102_n$ may not be limited to three but may include one or more dies, e.g. two, three, four, five, six, seven, eight, nine, ten or even more dies such as tens, hundreds or thousands of dies. Plurality of dies $102_1, 102_2, 102_3 \ldots 102_n$ may therefore each be initially individually separated from each other as they are selected and placed, e.g. sequentially placed, over common carrier 104. Adjacent dies of plurality of dies $102_1, 102_2, 102_3 \ldots 102_n$ may be separated by a separation distance ds. Separation distance ds may range from about 50 µm to about 5 mm.

Subsequently, once plurality of dies $102_1, 102_2, 102_3 \ldots 102_n$ are placed over carrier 104, they may be processed in order to form a reconstituted wafer, e.g. in an embedded wafer level process. It may be understood, that in addition to plurality of dies $102_1, 102_2, 102_3 \ldots 102_n$ being placed over carrier 104, plurality of electrically conductive blocks $106_1, 106_2, 106_3 \ldots 106_n$ may also be placed over carrier 104. Plurality of electrically conductive blocks $106_1, 106_2, 106_3 \ldots 106_n$ may be arranged over carrier 104, wherein at least one die of plurality of dies $102_1, 102_2, 102_3 \ldots 102_n$ may be arranged adjacent to at least one electrically conductive block of the plurality of electrically conductive blocks $106_1, 106_2, 106_3 \ldots 106_n$, e.g. at least one electrically conductive block of the plurality of electrically conductive blocks $106_1, 106_2, 106_3 \ldots 106_n$ may be disposed between consecutive dies of plurality of dies $102_1, 102_2, 102_3 \ldots 102_n$. Plurality of electrically conductive blocks $106_1, 106_2, 106_3 \ldots 106_n$ may be separated from plurality of dies $102_1, 102_2, 102_3 \ldots 102_n$, in other words, they may not necessarily be in direct contact with each other. It may be understood that plurality of dies $102_1, 102_2, 102_3 \ldots 102_n$ and electrically conductive blocks $106_1, 106_2, 106_3 \ldots 106_n$ may be temporarily adhered to carrier 104 via an electrically conductive medium, e.g. a glue, e.g. an adhesive paste (not shown). Plurality of electrically conductive blocks $106_1, 106_2, 106_3 \ldots 106_n$ may have a size in the range from about 50 µm×50 µm×50 µm to about 1000 µm×1000 µm×1000 µm, e.g. a size in the range from about 100 µm×100 µm×100 µm to about 500 µm×500 µm×500 µm.

Plurality of electrically conductive blocks $106_1, 106_2, 106_3 \ldots 106_n$ may each include at least part of a leadframe. Plurality of electrically conductive blocks $106_1, 106_2, 106_3 \ldots 106_n$ may each include at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy.

At least one of plurality of dies $102_1, 102_2, 102_3 \ldots 102_n$ may include at least part of a wafer substrate as described above. Alternatively, each of plurality of dies $102_1, 102_2, 102_3 \ldots 102_n$ may include at least part of a wafer substrate. At least one of plurality of dies $102_1, 102_2, 102_3 \ldots 102_n$ may include one or more electronic circuits formed within the wafer substrate, e.g. which may have already been formed through an earlier front end process. At least one of plurality of dies $102_1, 102_2, 102_3 \ldots 102_n$, may include at least part of a power semiconductor chip, wherein the power semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

It may be understood that plurality of dies $102_1, 102_2, 102_3 \ldots 102_n$ may not be limited to power semiconductor devices, but may also include logic devices, e.g. an application specific integrated chip ASIC, e.g. a driver, e.g. a controller, e.g. a sensor.

At least one die $102_1$ of plurality of dies $102_1, 102_2, 102_3 \ldots 102_n$ may include a top side $108_1$. Top sides $108_1, 108_2, 108_3, 108_4 \ldots 108_n$ may be understood to refer to the sides of plurality of dies $102_1, 102_2, 102_3 \ldots 102_n$ which carries one or more contact pads $114_1, 114_2, 114_3, 114_4 \ldots 114_n$, or electrical contacts, wherein bonding pads or electrical connects may be attached. Top sides $108_1, 108_2, 108_3, 108_4 \ldots 108_n$ may be understood to refer to the sides of plurality of dies $102_1, 102_2, 102_3 \ldots 102_n$ which are mostly covered by metallization layers (which may have been formed during an earlier back end of line BEOL process).

Top sides $108_1$, $108_2$, $108_3$, $108_4$ ... $108_n$ may face a direction substantially opposite to a direction which bottom sides $112_1$, $112_2$, $112_3$, $112_4$ ... $112_n$ face.

One or more electronic circuits formed in plurality of dies $102_1$, $102_2$, $102_3$ ... $102_n$ may be formed at the top sides $108_1$, $108_2$, $108_3$, $108_4$ ... $108_n$ of plurality of dies $102_1$, $102_2$, $102_3$ ... $102_n$.

Bottom sides $112_1$, $112_2$, $112_3$, $112_4$ ... $112_n$ may be understood to refer to sides of plurality of dies $102_1$, $102_2$, $102_3$ ... $102_n$ which may be generally free from metallization or contact pads or electrical contacts.

Top sides $108_1$, $108_2$, $108_3$, $108_4$ ... $108_n$ may also be referred to as a "first side", "front side" or "upper side" of plurality of dies $102_1$, $102_2$, $102_3$ ... $102_n$. The terms "top side", "first side", "front side" or "upper side" may be used interchangeably hereinafter. Bottom sides $112_1$, $112_2$, $112_3$, $112_4$ ... $112_n$ may also be referred to as "second side" or "back side" of plurality of dies $102_1$, $102_2$, $102_3$ ... $102_n$. The terms "second side", "back side", or "bottom side" may be used interchangeably hereinafter.

Carrier 104 may include a material, the material including at least one from the following group of materials, the group consisting of: metal, plastic, glass. In general the material may include an electrically conductive and/or an electrically insulating material.

Carrier 104 may provides a substantially level supporting structure over which plurality of dies $102_1$, $102_2$, $102_3$ ... $102_n$ may be arranged such that plurality of dies $102_1$, $102_2$, $102_3$ ... $102_n$ may be arranged substantially level with each other.

FIGS. 2A to 2I show that plurality of dies $102_1$, $102_2$, $102_3$ ... $102_n$ may be arranged over carrier 104, wherein the front sides, i.e. top sides $108_1$, $108_2$, $108_3$, $108_4$ ... $108_n$ of plurality of dies $102_1$, $102_2$, $102_3$ ... $102_n$ may face carrier 104. Top sides $108_1$, $108_2$, $108_3$, $108_4$ ... $108_n$ of plurality of dies $102_1$, $102_2$, $102_3$ ... $102_n$ may be placed over carrier first side 116, wherein top sides $108_1$, $108_2$, $108_3$, $108_4$ ... $108_n$ may face carrier first side 116. Therefore, top sides $108_1$, $108_2$, $108_3$, $108_4$ ... $108_n$ of plurality of dies $102_1$, $102_2$, $102_3$ ... $102_n$ and top sides $118_1$, $118_2$, $118_3$, $18_4$ ... $118_n$ of electrically conductive blocks $106_1$, $106_2$, $106_3$ ... $106_n$ may be arranged substantially level with each other over carrier 104. Various embodiments are however not limited to arranging all of plurality of dies $102_1$, $102_2$, $102_3$ ... $102_n$ have their front sides (e.g. a side of the dies which are already (not necessarily completely) processed at this stage) facing carrier 104.

According to various other embodiments, arranging plurality of dies $102_1$, $102_2$, $102_3$ ... $102_n$ over the carrier 104 may include arranging plurality of dies $102_1$, $102_2$, $102_3$ ... $102_n$ over carrier 104 wherein at least a portion of plurality of dies $102_1$, $102_2$, $102_3$ ... $102_n$ are arranged with their front sides, i.e. top sides $118_1$, $118_2$, $118_3$, $18_4$ ... $118_n$ over carrier 104.

According to various other embodiments, arranging plurality of dies $102_1$, $102_2$, $102_3$ ... $102_n$ over the carrier 104 may includes arranging plurality of dies $102_1$, $102_2$, $102_3$ ... $102_n$ over carrier 104 wherein at least a portion of plurality of dies $102_1$, $102_2$, $102_3$ ... $102_n$ are arranged with their back sides (e.g. those sides which are not yet processed at this stage and which may be opposite to the respective front sides), i.e. bottom sides $112_1$, $112_2$, $112_3$, $112_4$ ... $112_n$ over carrier 104.

According to various other embodiments, arranging plurality of dies $102_1$, $102_2$, $102_3$ ... $102_n$ over the carrier 104 may includes arranging plurality of dies $102_1$, $102_2$, $102_3$ ... $102_n$ over carrier 104 wherein at least a portion of plurality of dies $102_1$, $102_2$, $102_3$ ... $102_n$ are arranged with their back sides over carrier 104 and at least another portion of plurality of dies $102_1$, $102_2$, $102_3$ ... $102_n$ are arranged with their front sides over carrier 104.

According to various other embodiments, arranging plurality of dies $102_1$, $102_2$, $102_3$ ... $102_n$ over the carrier 104 may includes arranging plurality of dies $102_1$, $102_2$, $102_3$ ... $102_n$ over carrier 104 wherein at least a portion of plurality of dies $102_1$, $102_2$, $102_3$ ... $102_n$ are arranged with their lateral sides, e.g. one or more sidewalls, over carrier 104 and/or at least another portion of plurality of dies $102_1$, $102_2$, $102_3$ ... $102_n$ are arranged with their front sides over carrier 104, and/or at least a portion of plurality of dies $102_1$, $102_2$, $102_3$ ... $102_n$ are arranged with their back sides over carrier 104. The lateral sides of a die may refer to the sides between a die top side 108 and a die bottom side 112. Various other embodiments are shown in FIGS. 4A to 4D.

It may be understood that electrically conductive blocks $106_1$, $106_2$, $106_3$ ... $106_n$ may also include bottom sides $122_1$, $122_2$, $122_3$, $122_4$ ... $122_n$ wherein bottom sides $122_1$, $122_2$, $122_3$, $122_4$ ... $122_n$ may face a direction opposite to the direction which top sides $118_1$, $118_2$, $118_3$, $18_4$ ... $118_n$ face. Electrically conductive blocks $106_1$, $106_2$, $106_3$ ... $106_n$ may also have a thickness which is less than the thickness of plurality of dies $102_1$, $102_2$, $102_3$ ... $102_n$. Electrically conductive blocks $106_1$, $106_2$, $106_3$ ... $106_n$ may have a thickness which may be substantially equal to a desired eventual thickness of plurality of dies $102_1$, $102_2$, $102_3$ ... $102_n$. One or more or all of electrically conductive blocks $106_1$, $106_2$, $106_3$ ... $106_n$ may have a thickness (top side to bottom side) ranging from about 10 μm to about 300 μm, e.g. about 25 μm to 250 μm, e.g. about 50 μm to 100 μm.

In 220, plurality of dies $102_1$, $102_2$, $102_3$ ... $102_n$ may be commonly molded with encapsulation material 107 over carrier 104. For example, plurality of dies $102_1$, $102_2$, $102_3$ ... $102_n$ may be covered with the same encapsulation material 107 over the same carrier 104. Plurality of dies $102_1$, $102_2$, $102_3$ ... $102_n$ may be covered with the same encapsulation material 107 in a single process, alternatively, in a plurality of processes. Plurality of dies $102_1$, $102_2$, $102_3$ ... $102_n$ may be covered by means of the same process or processes.

Encapsulation material 107 may be deposited over carrier 104 wherein plurality of dies $102_1$, $102_2$, $102_3$ ... $102_n$ may be covered by encapsulation material 107 thereby forming structure 124 including encapsulation material 107 and plurality of dies plurality of dies $102_1$, $102_2$, $102_3$ ... $102_n$. Structure 124 may further include plurality of electrically conductive blocks $106_1$, $106_2$, $106_3$ ... $106_n$ at least partially surrounded by encapsulation material 107.

Encapsulation material 107 may include at least one from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

Figure 2B:
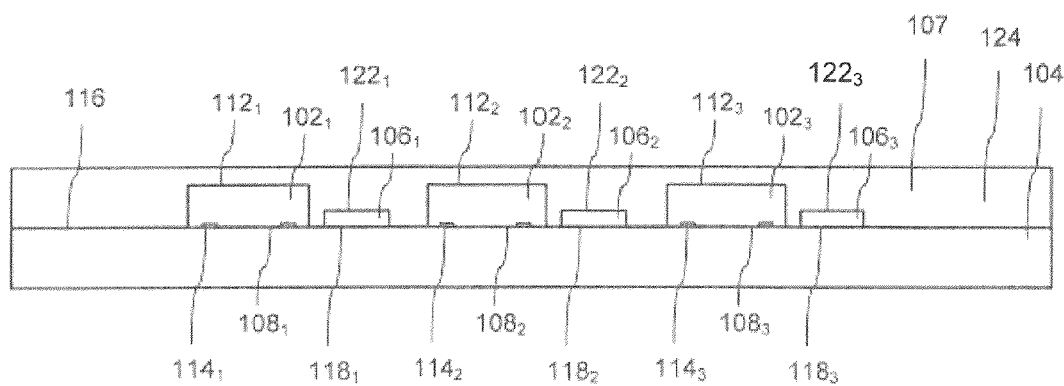
Figure 2C:
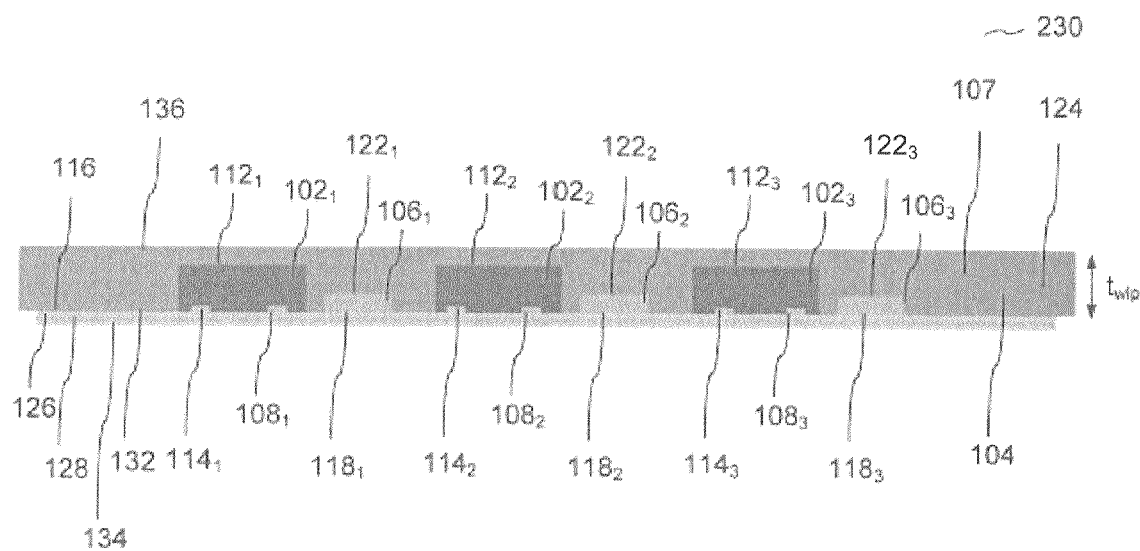
Figure 2D:
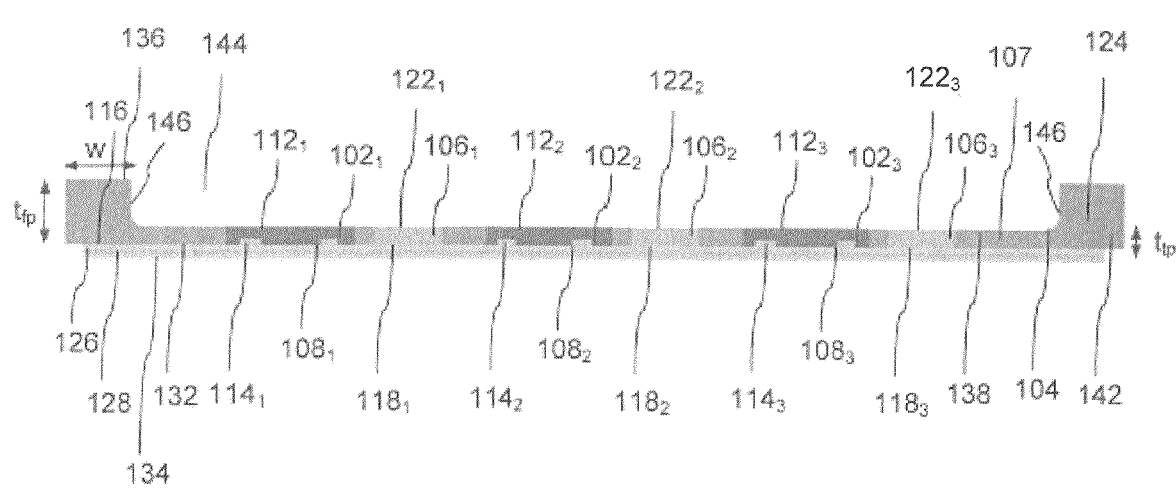

Encapsulation material 107 may be deposited over bottom sides $112_1$, $112_2$, $112_3$, $112_4$ ... $112_n$ of plurality of dies $102_1$, $102_2$, $102_3$ ... $102_n$. Encapsulation material 107 may be deposited between plurality of dies $102_1$, $102_2$, $102_3$ ... $102_n$. For example, encapsulation material 107 may be deposited between first die, e.g. die $102_1$, and second die, e.g. die $102_2$. In other words, encapsulation material 107 may be deposited in spaces between adjacent dies of plurality of dies $102_1$, $102_2$, $102_3$ ... $102_n$, e.g. between first die, e.g. die $102_1$, and second die, e.g. die $102_2$, between second die, e.g. die $102_2$ and third die, e.g. die $102_3$ and so forth. Furthermore, encapsulation material 107 may be deposited in spaces between plurality of dies $102_1$, $102_2$, $102_3$ ... $102_n$ and electrically conductive blocks $106_1$, $106_2$, $106_3$, $10_4$ ... $106_n$, e.g. between first die, e.g. die $102_1$, and first electrically conductive block $106_1$, e.g. between first electrically conductive block $106_1$ and second die, e.g. die $102_2$ and so forth. Sides of dies disposed on carrier 104, e.g. top sides and/or bottom sides and/or lateral sides disposed on carrier 104, may be substantially free of encapsulation material 107. As shown in FIG. 2B, as top sides $108_1$, $108_2$, $108_3$, $108_4$ ... $108_n$ may be disposed on carrier 104, top sides $108_1$, $108_2$, $108_3$, $108_4$ ... $108_n$ may be substantially free of encapsulation material 107.

It may be understood that plurality of dies $102_1$, $102_2$, $102_3$ ... $102_n$ may include an array of a plurality of dies $102_1$, $102_2$, $102_3$ ... $102_n$, e.g. a 1×n dimensional array of a plurality of dies $102_1$, $102_2$, $102_3$ ... $102_n$, e.g. an m×n (wherein m, n each are integers) dimensional array of a plurality of dies $102_1$, $102_2$, $102_3$ ... $102_n$. It may also be understood that plurality of dies $102_1$, $102_2$, $102_3$ ... $102_n$ may include a stacked arrangement, e.g. a stacked array of e.g. an m×n (wherein m, n each are integers) dimensional array of a plurality of dies $102_1$, $102_2$, $102_3$ ... $102_n$. Therefore, encapsulation material 107 may be deposited between adjacent rows and/or columns of plurality of dies $102_1$, $102_2$, $102_3$ ... $102_n$. Encapsulation material 107 may at least partially surround each die of plurality of dies $102_1$, $102_2$, $102_3$ ... $102_n$. Encapsulation material 107 may be formed over bottom sides $112_1$, $112_2$, $112_3$, $112_4$ ... $112_n$ and one or more sidewalls of plurality of dies $102_1$, $102_2$, $102_3$ ... $102_n$. The one or more sidewalls may refer to sides of plurality of dies $102_1$, $102_2$, $102_3$ ... $102_n$, extending between top sides $108_1$, $108_2$, $108_3$, $108_4$ ... $108_n$ and bottom sides $112_1$, $112_2$, $112_3$, $112_4$ ... $112_n$.

It may be understood that plurality of dies $102_1$, $102_2$, $102_3$ ... $102_n$ may be arranged over common carrier 104. Furthermore, encapsulation material 107 may be deposited over, e.g. to cover, plurality of dies $102_1$, $102_2$, $102_3$ ... $102_n$ in a batch process, e.g. simultaneously. The batch process wherein plurality of dies $102_1$, $102_2$, $102_3$ ... $102_n$ may be embedded, e.g. covered, with encapsulation material 107 together, instead of being individually treated, e.g. covered, may be referred to as a common molding process, wherein plurality of dies $102_1$, $102_2$, $102_3$ ... $102_n$ may be held together in single structure 124 by encapsulation material 107.

After deposition of encapsulation material 107 over plurality of dies $102_1$, $102_2$, $102_3$ ... $102_n$ and electrically conductive blocks $106_1$, $106_2$, $106_3$ ... $106_n$, carrier 104 may be removed. Structure 124 including plurality of dies $102_1$, $102_2$, $102_3$ ... $102_n$, electrically conductive blocks $106_1$, $106_2$, $106_3$ ... $106_n$ and encapsulation material 107 may be released, e.g. detached, from carrier 104. Structure 124 may include a reconstituted wafer including plurality of dies $102_1$, $102_2$, $102_3$ ... $102_n$, optionally electrically conductive blocks $106_1$, $106_2$, $106_3$ ... $106_n$, and encapsulation material 107, wherein plurality of dies $102_1$, $102_2$, $102_3$ ... $102_n$ and optionally electrically conductive blocks $106_1$, $106_2$, $106_3$ ... $106_n$, may be commonly molded, e.g. covered by encapsulation material 107. The sides of plurality of dies $102_1$, $102_2$, $102_3$ ... $102_n$ disposed over carrier 104, i.e. facing carrier 104, may be arranged substantially level with each other, and may be substantially free from encapsulation material 107 for subsequent processes. For example, structure 124 in FIG. 2B shows that structure 124 may include a reconstituted wafer including plurality of dies $102_1$, $102_2$, $102_3$ ... $102_n$, electrically conductive blocks $106_1$, $106_2$, $106_3$ ... $106_n$, and encapsulation material 107, wherein plurality of dies $102_1$, $102_2$, $102_3$ ... $102_n$ and electrically conductive blocks $106_1$, $106_2$, $106_3$ ... $106_n$, may be commonly molded, e.g. covered by encapsulation material 107, and wherein top sides $108_1$, $108_2$, $108_3$, $108_4$ ... $108_n$ of plurality of dies $102_1$, $102_2$, $102_3$ ... $102_n$ and top sides $118_1$, $118_2$, $118_3$, $18_4$ ... $118_n$ of electrically conductive blocks $106_1$, $106_2$, $106_3$ ... $106_n$ may be arranged substantially level with each other, and wherein top sides $108_1$, $108_2$, $108_3$, $108_4$ ... $108_n$ and top sides $118_1$, $118_2$, $118_3$, $18_4$ ... $118_n$ of electrically conductive blocks $106_1$, $106_2$, $106_3$ ... $106_n$ may be substantially free from encapsulation material 107 for subsequent processes.

Structure 124 may also be referred to as a "wafer level package", "embedded wafer level package" and/or a "reconstituted wafer". The terms may be used interchangeably hereinafter.

Subsequently, in 230, redistribution layers and passivation layers may be deposited over top sides $108_1$, $108_2$, $108_3$, $108_4$ ... $108_n$ of plurality of dies $102_1$, $102_2$, $102_3$ ... $102_n$. It may be understood that process 230 may optionally be carried out at this stage in the process, i.e. before process 240, but according to various other embodiments, may be carried out after process 240.

Electrically insulating layer 126 may be deposited over front sides, i.e. top sides $108_1$, $108_2$, $108_3$, $108_4$ ... $108_n$ of plurality of dies $102_1$, $102_2$, $102_3$ ... $102_n$ and/or over and top sides $118_1$, $118_2$, $118_3$, $18_4$ ... $118_n$ of electrically conductive blocks $106_1$, $106_2$, $106_3$ ... $106_n$.

One or more through-holes may be formed in electrically insulating layer 126 over a front side i.e. a top sides $108_1$ of at least one die $102_1$ from plurality of dies $102_1$, $102_2$, $102_3$ ... $102_n$. Electrically conductive material 128 may be deposited over electrically insulating layer 126 and in the one or more through-holes, wherein the electrically conductive material 128 electrically contacts the at least one die $102_1$.

The electrically conductive material 128 may electrically contact one or more electrical pads $114_1$ formed over the front side, i.e. top side $108_1$ of at least one die $102_1$.

It may also be possible to form one or more through-holes in electrically insulating layer 126 over a front side $108_1$ of at least one die $102_1$ from the plurality of dies $102_1$, $102_2$, $102_3$ ... $102_n$ and at least one electrically conductive block $106_1$. It may also be possible to deposit electrically conductive material 128 over electrically insulating layer 126 and in the one or more through-holes, wherein the electrically conductive material 128 in at least one through-hole electrically contacts at least one die $102_1$, and wherein electrically conductive material 128 in at least one other through-hole electrically contacts at least one electrically conductive block $106_1$. The deposition of electrically conductive material 128 may also be referred to as a formation process of a redistribution layer RDL.

According to an embodiment, the method may further include depositing electrically conductive material 128 over at least one side, e.g. side 132 and/or side 136 of structure 124, wherein the electrically conductive material 128 may be thicker than an eventual thinned portion 138 of structure 124. Thinned portion 138 may be formed in process 240. The thickness of the redistribution layer RDL may be greater than the thickness of the thinned dies $102_1$, $102_2$, $102_3$ ... $102_n$. In various embodiments, the thickness of the redistribution layer RDL may be in the range of e.g. more than about 5 µm, e.g. more than about 10 µm, e.g. more than about 20 µm, e.g. more than about 30 µm, e.g. more than about 40 µm, e.g. more than about 50 µm. In some embodiments, the redistribution layer RDL may even function as a stabilizing carrier for the thinned dies $102_1$, $102_2$, $102_3$ ... $102_n$.

One or more portions of the electrically conductive material deposited over electrically insulating layer 126 may be selectively removed.

Therefore, one or more electrically conductive portions 128, i.e. a redistribution layer may be formed over a first side 132 of wafer level package, i.e. structure 124; wherein at least one electrically conductive portion 128 of the one or more electrically conductive portions may be electrically connected to first die, e.g. die 102$_1$.

Other areas, e.g. surface areas of the plurality of dies 102$_1$, 102$_2$, 102$_3$ ... 102$_n$ not covered by one or more contact pads 114$_1$, 114$_2$, 114$_3$, 114$_4$ may be covered with electrically insulating material 126 to electrically insulate the other areas of the plurality of dies 102$_1$, 102$_2$, 102$_3$ ... 102$_n$ from their surroundings. For example at least one die, e.g. one or more dies, e.g. substantially all the dies, from the plurality of dies 102$_1$, 102$_2$, 102$_3$ ... 102$_n$ may be covered with encapsulation material 107 on their bottom sides 112$_1$, 112$_2$, 112$_3$, 112$_4$ ... 112$_n$, and on their sidewalls. Electrically insulating layer 126 may include at least one from the following group of materials, the group consisting of silicon dioxide, silicon nitride, polyimide, epoxy based material. Electrically insulating layer 126 may include at least one from the following group of materials, the group consisting of filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

It may also be understood that contact pads formed over the dies may also be electrically insulated from each other. Using die 102$_1$ as an example, electrically insulating material (not shown) may be formed, over and/or on top side 108$_1$, wherein electrically insulating material, e.g. a dielectric material, may be deposited over areas of top side 108$_1$ not covered by one or more contact pads 114$_1$. If more than one contact pad 114$_1$ is formed over top side 108$_1$, each of one or more contact pads 114$_1$ may therefore, be electrically isolated from each other. For example, a first of one or more contact pads 114$_1$ may be electrically isolated from a second of one or more contact pads 114$_1$ by an electrically insulating material, e.g. silicon dioxide, formed over top side 108$_1$.

One or more electrically conductive portions 128 e.g. electrically conductive material and any other electrically conductive portions not included in the figures may be deposited in a single process, according to at least one of the following methods. For example by galvanic deposition, electroplating, galvanic electroplating, evaporation, sputtering, chemical deposition, e.g. chemical vapor deposition, e.g. plasma-enhanced chemical vapor deposition.

One or more electrically conductive portions e.g. electrically conductive portions 128 may include at least one material, element or alloy from the following group of materials, the group consisting of: copper, aluminum, silver, tin, gold, palladium, zinc, nickel, iron, tungsten, molybdenum, tantalum, titanium, vanadium.

One or more contact pads 114$_1$, 114$_2$, 114$_3$, 114$_4$, may include at least one material, element or alloy from the following group of materials, the group consisting of: copper, aluminum, silver, tin, gold, palladium, zinc, nickel, iron, tungsten, molybdenum, tantalum, titanium, vanadium.

One or more electrically conductive portions 128 may include at least one from the following group of electrically conductive portions, the group consisting of: wires, electrically conductive wires, bond wires, clips, electrically conductive clips, galvanically deposited interconnects. One or more electrically conductive portions 128 in the form of wires, may be adhered to the chip contacts, e.g. one or more contact pads 114$_1$, 114$_2$, 114$_3$, 114$_4$ by means of an electrically conductive adhesive, e.g. a solder, e.g. a soft solder, e.g. a diffusion solder, e.g. a paste, e.g. an electrically conductive glue, or plasma deposition.

Subsequently, passivation layer 134 may be deposited over structure top side 132. Passivation layer 134 may be deposited over encapsulation material 107 over structure top side 132. Passivation layer 134 may be deposited over one or more electrically conductive portions 128. Passivation layer 134 may be deposited, such that passivation layer 134 may at least partially surround one or more electrically conductive portions 128, e.g. electrically insulating each of one or more electrically conductive portions 128 from its surroundings, and from each other.

Passivation layer 134 may include an electrically insulating material. Passivation layer 134 may include at least one from the following group of materials, the group consisting of silicon dioxide, silicon nitride, polyimide, epoxy based material. Passivation layer 134 may include at least one from the following group of materials, the group consisting of filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

As structure 124 may be at least part of a wafer level package, processing thus far, and subsequent handling of the dies may be carried out on a single wafer level package, instead of on individual dies. According to various embodiments, wafer level package e.g. structure 124 may have a thickness $t_{wlp}$ ranging from about 300 μm to about 2 mm, e.g. about 400 μm to 1 mm, e.g. about 500 μm to 850 μm.

In 240, thinning of the wafer level package may be carried out. In 240, encapsulation material 107 may be removed thereby forming a thinned portion 138 of structure 124 and a further portion 142 of structure 124 including encapsulation material thicker than thinned portion 138. Removing encapsulation material 107 thereby forming a thinned portion 138 of structure 124 and a further portion 142 of structure 124 including encapsulation material thicker than thinned portion 138 may include thinning encapsulation material 107 and a portion of the dies from a side of the structure 124 opposite to sides of the plurality of dies arranged over the carrier.

Thinning the wafer level package may include thinning encapsulation material 107 and plurality of dies plurality of dies 102$_1$, 102$_2$, 102$_3$ ... 102$_n$ from a side of structure 124 opposite to the front sides 108$_1$, 108$_2$, 108$_3$, 108$_4$ ... 108$_n$ of plurality of dies 102$_1$, 102$_2$, 102$_3$ ... 102$_n$, thereby forming a thinned portion 138 of structure 124 and further portion 142 of structure 124 including encapsulation material 107 thicker than thinned portion 138. After thinning, one or more bottom sides 122$_1$, 122$_2$, 122$_3$, 122$_4$ ... 122$_n$ of plurality of electrically conductive blocks 106$_1$, 106$_2$, 106$_3$ ... 106$_n$ may be exposed, i.e. released from encapsulation material 107, from a side of structure 124 opposite to the front sides 108$_1$, 108$_2$, 108$_3$, 108$_4$ ... 108$_n$ of plurality of dies 102$_1$, 102$_2$, 102$_3$ ... 102$_n$.

Thinned portion 138 of structure 124 may have a thickness $t_{tp}$ ranging from about 10 μm to about 300 μm, e.g. about 25 μm to 250 μm, e.g. about 50 μm to 100 μm.

Redistribution layers, e.g. electrically conductive portions 128 may be thicker than thinned portion 138 of structure 124, and may function as a supporting carrier for structure 124 to prevent deflection and/or bending of structure 124.

Further portion 142 of structure 124 wafer level package e.g. structure 124 may have a thickness $t_{fp}$ ranging from about 300 μm to about 2 mm, e.g. about 400 μm to 1 mm, e.g. about 500 μm to 850 μm. Thickness $t_{fp}$ of further portion 142 may be substantially equal to the thickness of wafer level package $t_{wlp}$.

Thinning encapsulation material 107 and plurality of dies $102_1, 102_2, 102_3 \ldots 102_n$ may include grinding a back side 136 of structure 124, the grinding thereby removing encapsulation material 107 from the back side 136 of structure 124 and from a back side, i.e. bottom side region $112_1, 112_2, 112_3, 112_4 \ldots 112_n$ of plurality of dies $102_1, 102_2, 102_3 \ldots 102_n$.

Thinning encapsulation material 107 and plurality of dies $102_1, 102_2, 102_3 \ldots 102_n$ may include chemically removing a back side 136 of structure 124, thereby removing encapsulation material 107 from the back side 136 of structure 124 and from a back side, i.e. bottom side region $112_1, 112_2, 112_3, 112_4 \ldots 112_n$ of plurality of dies $102_1, 102_2, 102_3 \ldots 102_n$.

Removing encapsulation material 107 thereby forming a thinned portion 138 of structure 124 and a further portion 142 of structure 124 including encapsulation material thicker than thinned portion 138 may include removing encapsulation material 107 from a side 136 of structure 124 opposite to sides of the plurality of dies (front sides or back sides) arranged over carrier 104 thereby forming a thinned inner portion 138 and a further outer portion 142 thicker than the thinned inner portion 138 of structure 124.

According to various embodiments, thinning encapsulation material 107 and plurality of dies $102_1, 102_2, 102_3 \ldots 102_n$ may include thinning encapsulation material 107 and plurality of dies plurality of dies $102_1, 102_2, 102_3 \ldots 102_n$ from a side 136 of structure 124 opposite to the front sides $108_1, 108_2, 108_3, 108_4 \ldots 108_n$ of plurality of dies $102_1, 102_2, 102_3 \ldots 102_n$ if front sides $108_1, 108_2, 108_3, 108_4 \ldots 108_n$ of plurality of dies $102_1, 102_2, 102_3 \ldots 102_n$ are arranged to face carrier 104. Cavity 144 may be formed in structure 124, wherein cavity 144 may be defined by thinned portion 138 and further portion 142. In other words, cavity 144 may be defined by thinned portion 138, e.g. forming a bottom wall of cavity 144, and thicker encapsulation material 107 of further portion 142 of the structure 124 forming sidewalls 146 of cavity 144.

Figure 2E:
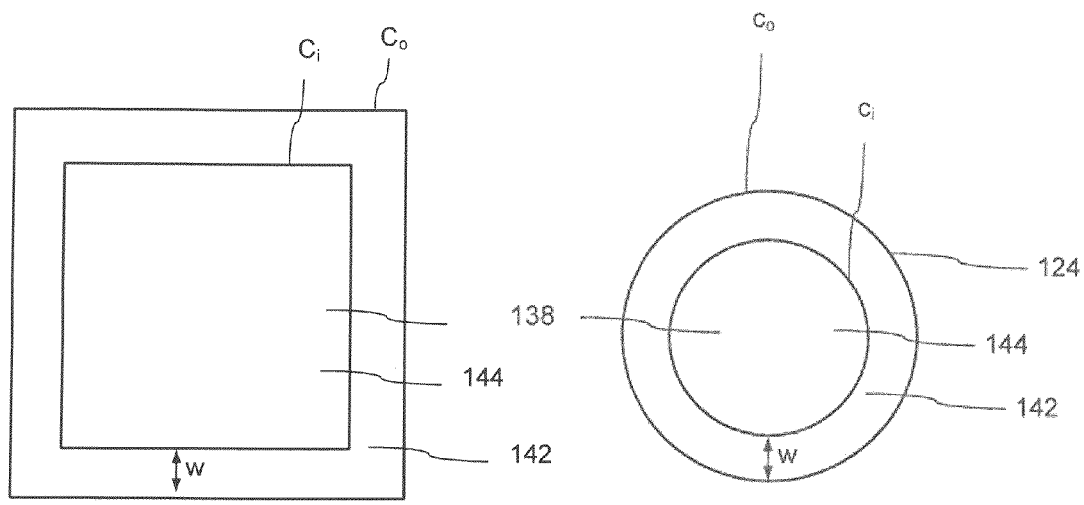
Figure 2F:
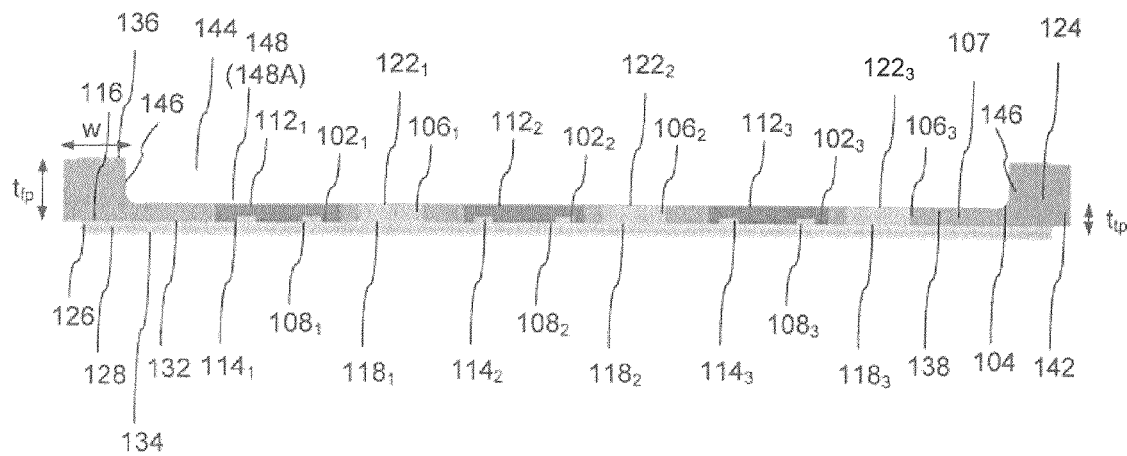
Figure 2G:
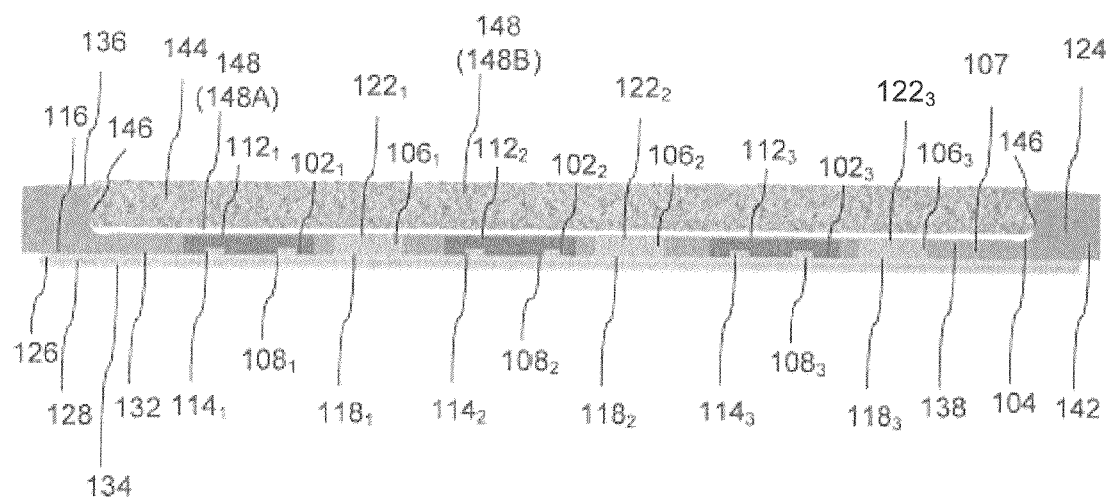
Figure 2H:
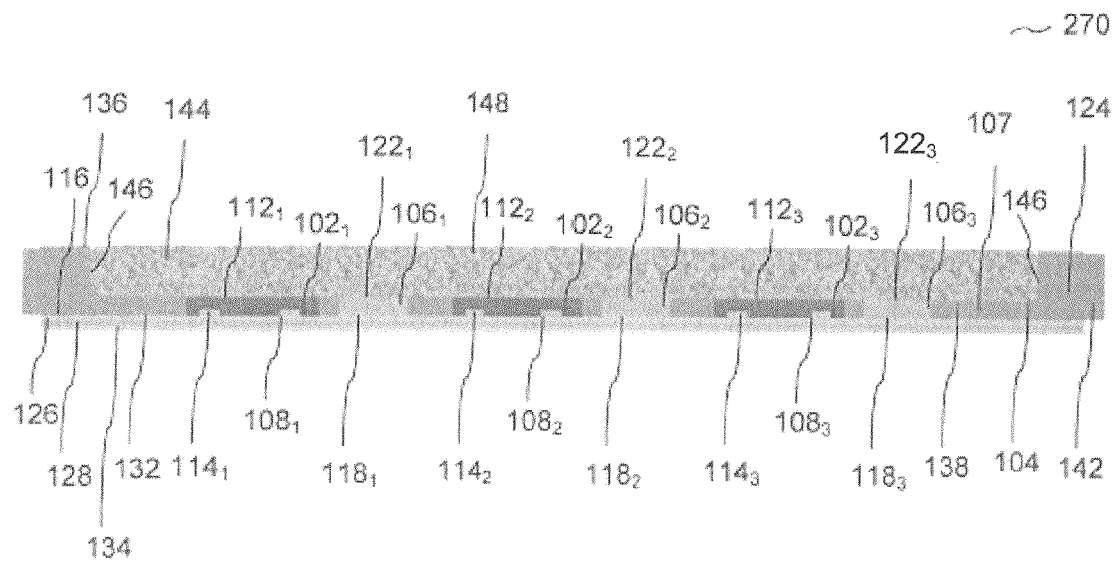
Figure 2I:
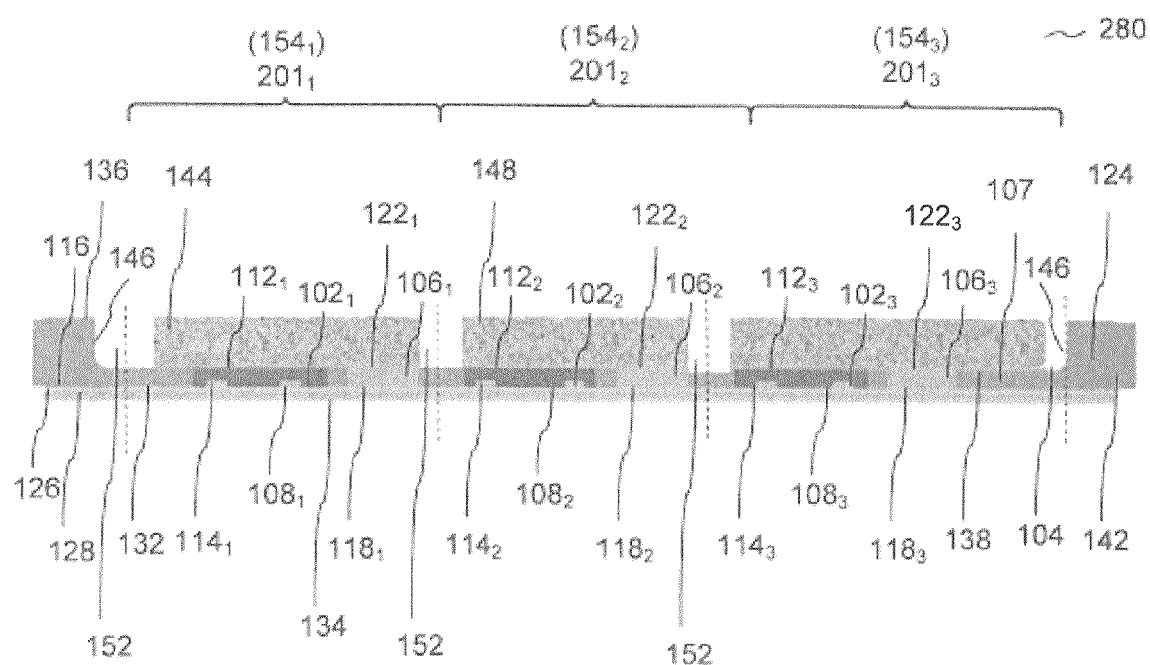

Further portion 142 may substantially border thinned portion 138. As shown in FIG. 2E, thinned portion 138 may define an inner circumference $c_i$ of structure 124 and further portion 142 of structure 124 including encapsulation material 107 thicker than thinned portion 138, may define an outer circumference $c_o$ of structure 124. It may be understood that various embodiments are not only limited to including circular substrates 124, but may also include substrates 124 which are square, rectangular, polygonal, or the like.

Structure 124 may have a diameter ranging from about 25 mm to about 600 mm, e.g. about 100 mm to about 450 mm, e.g. about 100 mm to about 350 mm, e.g. about 200 mm to about 300 mm.

Inner circumference $c_i$ of structure 124 may describe a circumference of a round inner region or a square inner region or a rectangular inner region or a polygonal inner region. Furthermore, outer circumference $c_o$ may describe a circumference of a round outer region or a square outer region or a rectangular outer region or a polygonal outer region. Removal and/or grinding of the inner region to form thinner portion 138 may leave a thicker encapsulation material region, e.g. including thick mold regions, e.g. in partially in the center and/or in an edge region of further portion 142 which increases stiffness of structure 124. Width w of further portion 142 may range from between about 1 mm to about 5 mm, e.g. about 2 mm to about 4 mm, e.g. about 2.5 mm to about 3.5 mm. Width w may be understood to be a distance between (e.g. inner) circumference $c_i$ of structure 124 and outer circumference $c_o$ of structure 124. Removal of encapsulation material 107 thereby forming a thinned portion 138 of structure 124 and a further portion 142 of structure 124 including encapsulation material thicker than thinned portion 138 according to various other embodiments are shown in FIGS. 5A to 5E.

According to an embodiment, removing encapsulation material 107 thereby forming a thinned portion 138 of structure 124 and a further portion 142 of structure 124 including encapsulation material thicker than thinned portion 138 may include thinning encapsulation material 107 and one or more dies $102_1, 102_2, 102_3 \ldots 102_n$ from a side 136 of structure 124 opposite to sides of the one or more dies arranged over carrier 104, i.e. sides (back front sides and/or back sides) of the one or more dies at side 132 of structure 124, thereby forming a thinned outer portion 138 and a further inner portion 142 thicker than the thinned outer portion 138 of structure 124.

In 250 and 260, electrically conductive layer 148 may be deposited over thinned portion 138 of structure 124, wherein electrically conductive layer 148 may electrically contact the back sides $112_1, 112_2, 112_3, 112_4 \ldots 112_n$ of plurality of dies $102_1, 102_2, 102_3 \ldots 102_n$. Electrically conductive layer 148 may be deposited within cavity 144, and over back sides $112_1, 112_2, 112_3, 112_4 \ldots 112_n$ of plurality of dies $102_1, 102_2, 102_3 \ldots 102_n$, back sides, i.e. bottom sides $122_1, 122_2, 122_3, 122_4 \ldots 122_n$ of plurality of electrically conductive blocks $106_1, 106_2, 106_3 \ldots 106_n$, and encapsulation material 107.

Electrically conductive layer 148 may include at least one material, element or alloy from the following group of materials, the group consisting of: copper, aluminum, silver, tin, gold, palladium, zinc, nickel, iron, tungsten, molybdenum, tantalum, titanium, vanadium.

Depositing electrically conductive layer 148 may include depositing first electrically conductive layer 148A, which may include a seed layer.

Seed layer 148A may include at least one from the following group of materials, the group of materials consisting of: copper, aluminum, silver, tin, gold, palladium, zinc, nickel, iron, tungsten, molybdenum, tantalum, titanium, vanadium. Seed layer 148A may have at thickness ranging from about 1 nm to about 500 nm, e.g. about 5 nm to about 100 nm, e.g. about 5 nm to about 25 nm, e.g. about 5 nm to about 10 nm.

Depositing electrically conductive layer 148 may further include depositing second electrically conductive layer, i.e. plating layer 148B, and e.g. filling cavity 144 with plating layer 148B. An electrolytic joining process may be carried out to electrically connect electrically conductive layer 148, e.g. including first electrically conductive layer 148A and second electrically conductive layer 148B, to back sides $112_1, 112_2, 112_3, 112_4 \ldots 112_n$ of plurality of dies $102_1, 102_2, 102_3 \ldots 102_n$, and back sides, i.e. bottom sides $122_1, 122_2, 122_3, 122_4 \ldots 122_n$ of plurality of electrically conductive blocks $106_1, 106_2, 106_3 \ldots 106_n$.

Depositing electrically conductive layer 148 over thinned portion 138 of structure 124, may further include electrically connecting a side, e.g. back side $112_1$ and/or front side $108_1$ of at least one die $102_1$ to the at least one electrically conductive block $106_1$, e.g. to bottom side $122_1$ and/or top side $118_1$, via electrically conductive layer 148. It may be further understood that electrically connecting a back side $112_1$ of at least one die $102_1$ may support a vertical (top to bottom side) current flow through an electronic circuit in the at least one die $102_1$, e.g. in power devices. Electrically conductive block $106_1$ may provide a through mold via, e.g. a TMV through encapsulation material 107 from back side $112_1$ to front side $118_1$.

Electrically conductive layer 148 may be deposited over thinned portion 138 of structure 124 of the cavity 144. Electrically conductive layer 148 may fill cavity 144 via a galvanic process.

According to other embodiments, electrically conductive layer 148 may be deposited by at least one process from the following group of processes, the group consisting of: galvanic deposition, electroplating, plasma deposition, particles deposition, soldering, electrolytic deposition, chemical deposition, chemical vapor deposition, plasma enhanced chemical vapor deposition Optionally, a solder mount step may be carried out If required, solder material, e.g. a solder bump, e.g. a solder ball which may include e.g. a soft solder, e.g. a diffusion solder, may be deposited over the one or more electrically conductive portions 128. For example, a solder ball may be electrically connected to one or more contact pads $114_1$. Another solder ball may be electrically connected to electrically conductive block $106_1$. The solder mount may be used for subsequently electrically connecting the chip packages to a circuit board.

In 280, one or more portions 152 of electrically conductive layer 148 may be removed from thinned portion 138 of structure 124. One or more portions to be removed 152 may include portions of electrically conductive layer 148 arranged between first die-block pair $154_1$ and second die-block pair $154_2$. First die-block pair $154_1$ may include die, e.g. $102_1$ and electrically conductive block, e.g. $106_1$, and second die-block pair $154_2$ may include die, e.g. $102_2$ and electrically conductive block, e.g. $106_2$.

One or more portions 152 of electrically conductive layer 148 may be removed, e.g. by an etching process, e.g. chemical etching and/or plasma etching.

Plurality of dies $102_1$, $102_2$, $102_3$ ... $102_n$ may subsequently be separated, e.g. diced, e.g. sawed, through encapsulation material 107. It may be understood that plurality of dies $102_1$, $102_2$, $102_3$ ... $102_n$ may separated at the removed one or more portions 152, i.e. at the locations wherein one or more portions 152 of electrically conductive layer 148 may be removed. This may simplify the dicing process, wherein separation, e.g. dicing and/or sawing may not need to be carried out through electrically conductive layer 148.

As a result individualized chip packages $201_1$, $201_2$, $201_3$ ... $201_n$ may be formed, wherein each chip package may include a thinned die, e.g. a very thin die (less than 200 µm thick), e.g. an ultra-thin die (less than 100 µm thick).

Figure 3:
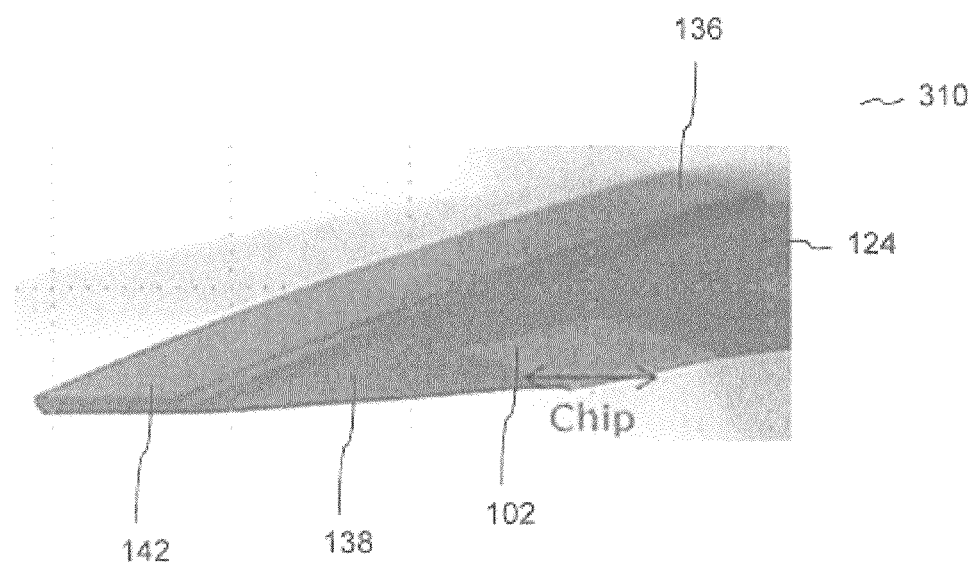
FIG. 3 shows parts of a chip package according to an embodiment.

FIG. 3 shows part of a chip package according to an embodiment. FIG. 3 shows an embedded wafer level package, e.g. embedded wafer level ball grid array eWLB ring edge, i.e. further portion 142, and step region, i.e. of thinned portion 138.

FIG. 3 shows a back side 136 of structure 124 (upward facing), wherein structure 124 may include further portion 142, e.g. a ring including encapsulation material 107 and thinned portion 138. According to various embodiments, a redistribution layer 128 may be formed before thinning the encapsulation material and the plurality of dies. As shown in FIG. 3, the redistribution layer 128 may be optional at this stage and may be added on side 132 and/or side 136 of structure a later stage, after thinning of structure 124, e.g. after removing encapsulation material 107 thereby forming a thinned portion 138 of structure 124 and a further portion 142 of structure 124 including encapsulation material thicker than thinned portion 138.

FIGS. 4A to 4D show methods for manufacturing a chip package according to various embodiments. The methods described according to FIGS. 4A to 4D may include one or more or all of the features already described with respect to method 200.

FIG. 4A shows a method for manufacturing a chip package according to an embodiment, wherein plurality of dies $102_1$, $102_2$, $102_3$ ... $102_n$ may be arranged over carrier 104 wherein at least a portion of plurality of dies $102_1$, $102_2$, $102_3$ ... $102_n$ are arranged with their back sides, i.e. bottom sides $112_1$, $112_2$, $112_3$, $112_4$ ... $112_n$ over carrier 104. Removing encapsulation material 107 thereby forming a thinned portion 138 of structure 124 and a further portion 142 of structure 124 including encapsulation material thicker than thinned portion 138 may include thinning encapsulation material 107 and a portion of the dies from a side 132 of structure 124 which may be formed on the same sides, (in this case bottom sides $112_1$, $112_2$, $112_3$, $112_4$ ... $112_n$) of plurality of dies arranged over carrier 104.

FIG. 4B shows a method for manufacturing a chip package according to an embodiment, wherein plurality of dies $102_1$, $102_2$, $102_3$ ... $102_n$ may be arranged over carrier 104 wherein at least a portion of plurality of dies $102_1$, $102_2$, $102_3$ ... $102_n$ are arranged with their back sides, i.e. bottom sides $112_1$, $112_2$, $112_3$, $112_4$ ... $112_n$ over carrier 104. Removing encapsulation material 107 thereby forming a thinned portion 138 of structure 124 and a further portion 142 of structure 124 including encapsulation material thicker than thinned portion 138 may include thinning encapsulation material 107 and a portion of the dies from side 136 of structure 124, opposite to sides i.e. bottom sides $112_1$, $112_2$, $112_3$, $112_4$ ... $112_n$ of plurality of dies arranged over carrier 104.

FIG. 4C shows a method for manufacturing a chip package according to an embodiment, wherein plurality of dies $102_1$, $102_2$, $102_3$ ... $102_n$ may be arranged over carrier 104 wherein at least a portion (e.g. $102_2$, $102_3$) of plurality of dies $102_1$, $102_2$, $102_3$ ... $102_n$ are arranged with their back sides over carrier 104 and at least another portion (e.g. $102_1$, $102_4$) of plurality of dies $102_1$, $102_2$, $102_3$ ... $102_n$ are arranged with their front sides over carrier 104. Removing encapsulation material 107 thereby forming a thinned portion 138 of structure 124 and a further portion 142 of structure 124 including encapsulation material thicker than thinned portion 138 may include thinning encapsulation material 107 and a portion of the dies (e.g. $102_1$, $102_4$) from side 136 of structure 124 thereby forming a thinned outer portion 138 and a further inner portion 142 thicker than the thinned outer portion 138 of structure 124.

It may be understood that therefore according to various embodiments, both the thinned portion 138 and the further portion 142 including encapsulation material 107 may include at least one die.

According to various embodiments, alternatively, encapsulation material 107 and a portion of the dies (e.g. $102_2$, $102_3$) may be thinned from side 132 of structure 124 instead of side 136 of structure 124 thereby forming a thinned inner portion 138 and a further outer portion 142 thicker than the thinned inner portion 138 of structure 124.

According to various embodiments, encapsulation material 107 and a portion of the dies (e.g. $102_2$, $102_3$) may be thinned from side 132 of structure 124 in addition to thinning from side 136 of structure 124 thereby forming a thinned inner portion 138 and a further outer portion 142 thicker than the thinned inner portion 138 of structure 124.

FIG. 4D shows a method for manufacturing a chip package according to an embodiment, wherein plurality of dies $102_1$, $102_2$, $102_3$ ... $102_n$ may be arranged over carrier 104 wherein at least a portion (e.g. $102_1$, $102_2$) of plurality of dies $102_1$, $102_2$, $102_3$ ... $102_n$ are arranged with their back sides over carrier 104 and at least another portion (e.g. 102$_3$) of plurality of dies 102$_1$, 102$_2$, 102$_3$ ... 102$_n$ are arranged with their front sides over carrier 104. Removing encapsulation material 107 thereby forming a thinned portion 138 of structure 124 and a further portion 142 of structure 124 including encapsulation material thicker than thinned portion 138 may include thinning encapsulation material 107 and a portion of the dies (e.g. 102$_3$, 102) from side 136 of structure 124 thereby forming one or more thinned portions 138A, 138B and one or more further portions 142A, 142B thicker than one or more thinned portions 138A, 138B structure 124.

According to various embodiments described with respect to FIGS. 2A to 2I and FIGS. 4A to 4D, redistribution layers (including electrically conductive portions 128 and/or passivation layer 134) may be formed before and/or after thinning the encapsulation material and the plurality of dies.

Furthermore, metallization processes, e.g. forming of redistribution layers (including electrically conductive portions 128 and/or passivation layer 134), e.g. forming of electrically conductive layer 148, may allow double sided processing (e.g. metallization) to becarried outover side 132 and/or side 136 of structure 124 before and/or after thinning.

FIG. 5 shows methods for manufacturing a chip package according to various embodiments. The methods described according to FIGS. 5A to 5E may include one or more or all of the features already described with respect to method 200.

Figure 5A:
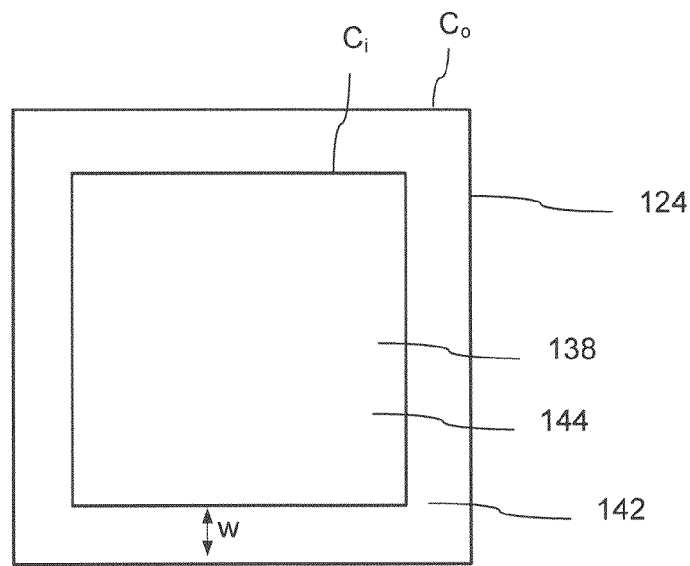
FIGS. 5A to 5E shows methods for manufacturing a chip package according to various embodiments.

As shown in FIG. 5A, removing encapsulation material 107 may include forming a thinned portion 138 of structure 124 and a further portion 142 of structure 124 including encapsulation material thicker than thinned portion 138, thereby forming a thinned inner portion 138 (e.g. cavity 144) and a further outer portion 142 thicker than the thinned inner portion 138 of structure 124.

As shown in FIG. 5A, various embodiments may not be only limited to including circular substrates 124, but may also include substrates 124 which are square, rectangular, polygonal. Therefore, inner circumference $c_i$ of structure 124 may describe a circumference of a round inner region or a square inner region or a rectangular inner region or a polygonal inner region. Furthermore, outer circumference $c_o$ may describe a circumference of a round outer region or a square outer region or a rectangular outer region or a polygonal outer region.

Figure 5B:
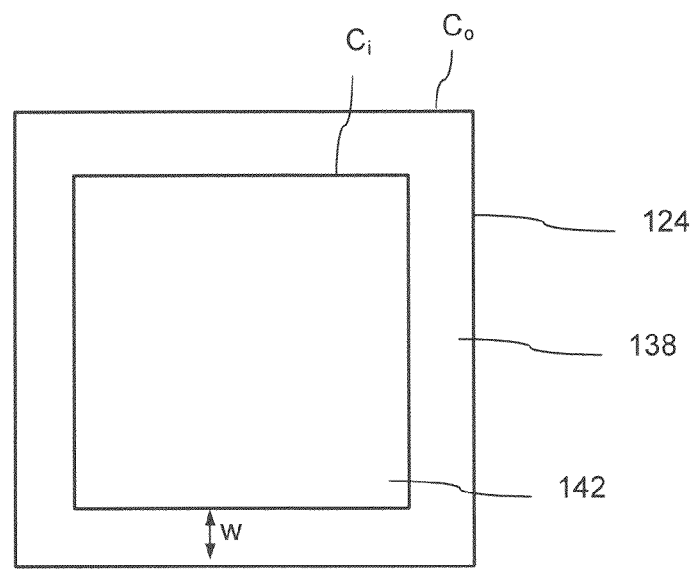

As shown in FIG. 5B, according to various embodiments, removing encapsulation material 107 may include forming a thinned outer portion 138 (described by outer circumference $c_o$) of structure 124 and a further inner portion 142 (described by inner circumference $c_i$) of structure 124 including encapsulation material thicker than thinned outer portion 138 of structure.

Figure 5C:
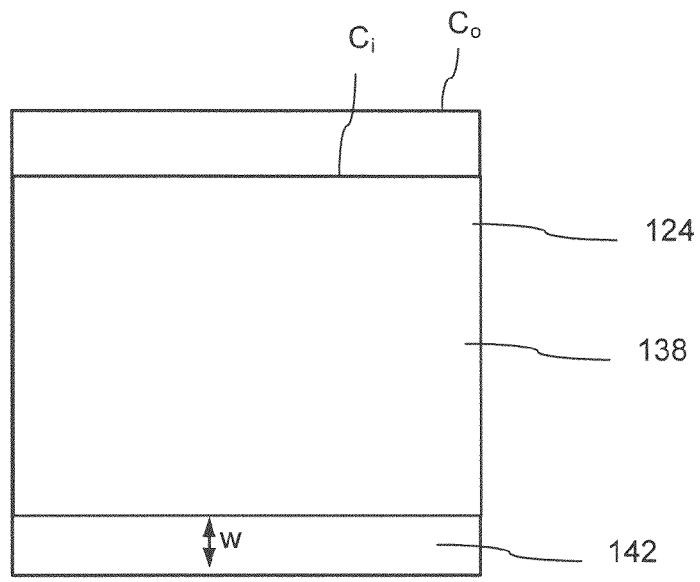
Figure 5D:
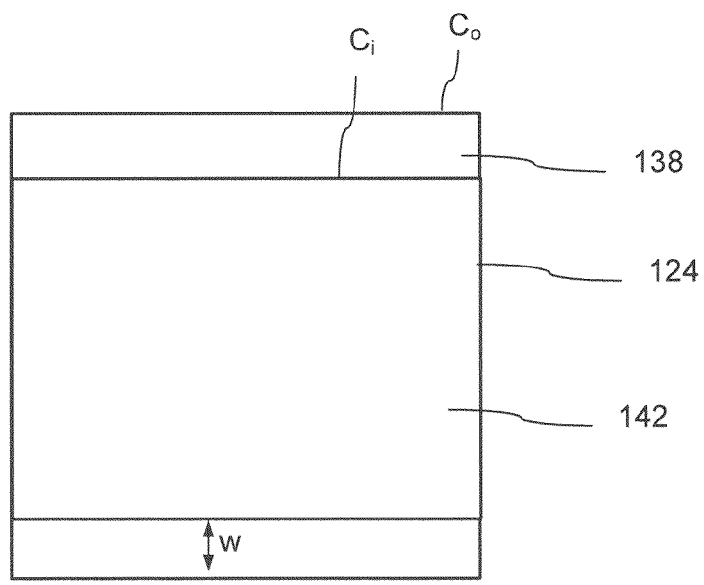

As shown in FIGS. 5C and 5D, according to various embodiments, removing encapsulation material 107 thereby forming a thinned portion 138 and a further portion 142 thicker than the thinned portion 138 of structure 124, may not be limited to include forming a defined inner region and a closed frame and/or fully surrounded around the inner region. Removing encapsulation material 107 may include forming a thinned portion 138 of structure 124 at one or more edge regions of structure 124, and forming one or more further portions 142 at one or more other edge regions of structure 124.

Figure 5E:
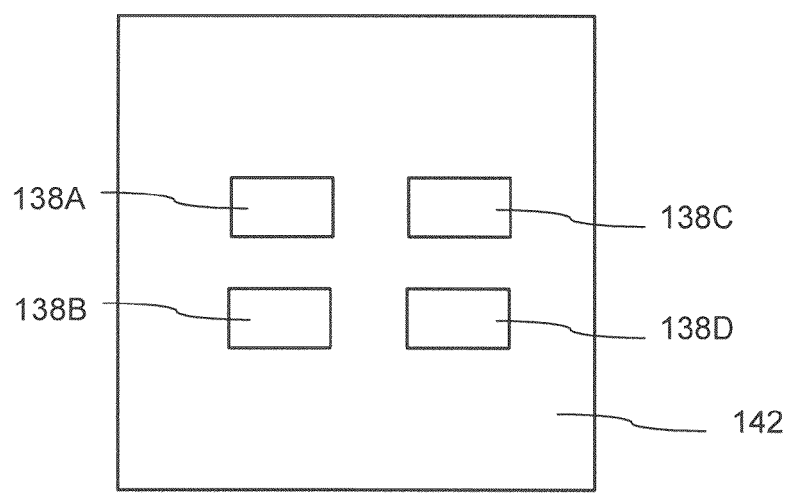

As shown in FIG. 5E, according to various embodiments, removing encapsulation material 107 thereby forming a thinned portion 138 of structure 124 and a further portion 142 of structure 124 including encapsulation material thicker than thinned portion 138 may include thinning encapsulation material 107 and a portion of the dies (e.g. 102$_3$, 102) from side 132 and/or side 136 of structure 124 thereby forming one or more thinned portions 138A, 138B and one or more further portions 142A, 142B thicker than one or more thinned portions 138A, 138B structure 124.

FIG. 6 shows method 600 for manufacturing a chip package according to an embodiment. Method 600 may include arranging a plurality of dies over a carrier (in 610);

depositing encapsulation material over the carrier wherein the plurality of dies are covered by the encapsulation material thereby forming a structure including the encapsulation material and the plurality of dies (in 620); and forming one or more electrical interconnects over a first side of the plurality of dies before thinning the encapsulation material and the plurality of dies from a second side of the structure opposite to the first side of the plurality of dies (in 630).

Various embodiments provide a method for manufacturing a wafer level package, wherein ultra thin chips need not be individually handled. Furthermore, as deposition of electrically conductive materials, e.g. electrically conductive portions 128, e.g. electrically conductive layer 148, on both sides of the dies may be carried out by depositing galvanic contacts, the use of solder materials/and or glue may be avoided.

Furthermore die attach, i.e. the process of placing the die in a package, may be carried out at room temperatures, and may achieve much higher placement accuracy. Therefore, further processing may be much less inexpensive and with higher alignment yields. Furthermore, components with smaller structure sizes may be rewired together in one or more common processes, e.g. a single process.

Various embodiments provide a method for manufacturing package, wherein unthinned chips, e.g. power chips, may be individualized and embedded in a wafer package together with electrically conductive contacts, e.g. electrically conductive blocks. Following which, active chip side may be rewired using thin or thick film techniques. Optionally, grinding of the back side may take place to a thickness wherein the structure, i.e. the wafer package, may be handled. Grinding may take place such that a stiff supporting structure may be used to support the grinded portion. Silicon damage etching may optionally be carried out. A seed layer, e.g. a copper seed layer may be deposited. Optionally, structuring of the seed layer may be carried out. At least one of copper powder, and/or copper plating, and/or copper paste may be applied. A galvanic process may take place to form the connection. Structuring of the structure, e.g. the wafer level package and etching the copper layer may be carried out. Individualization of the wafer level package may be carried out.

Various embodiments provide a method for manufacturing package, wherein a wafer, e.g. a silicon wafer having a diameter of approximately 150 mm 200 mm or 300 mm may be exclusively processed on the active side for power electronics, without back side process. Individualization may be carried out on the unthinned wafer, and pick and place of thick chips can be carried out using fast standard machines carried out (flip chip bond or SMT placer). Subsequent processes may be carried out in encapsulation material e.g. (eWLB200, eWLB300 oder eWLB300$^2$), e.g. wrapping the chips, e.g. with encapsulation material 107 as described in 220. Redistribution layers RDL may be deposited on the active chip side as described in 230. Thinning of the wafer level package, e.g. the plastic wafer may be carried out as described in 240. Further thinning of chip may be carried out with etching. Back side processing including deposition of galvanic contacts, e.g. copper contacts may be carried out as described in 250 to 270. Solder balls and/or solder bumps may be applied, e.g. electrically contact to redistribution layer RDL, e.g. electrically conductive portions 128. Testing laser marking may be carried out. Singulation of the wafer level package may be carried out through the encapsulation material 107, e.g. through plastic.

Various embodiments provide a method for manufacturing a chip package, which provides a stabilisation of a thinner portion, e.g. a thinner encapsulated wafer and/or panel through an enforcement ring on plastic. Thinning in package, i.e. placing thick chips in a package, followed by thinning, may be difficult to achieve for thicknesses thinner than 300 µm, as excessive bending and/or deflection may occur.

Various embodiments provide a method for manufacturing a chip package, which may avoid handling ultra thin chips e.g. chip thinner than 100 µm individually.

Various embodiments provide a method for manufacturing a chip package, which may avoid soldering of ultra thin chips e.g. chip thinner than 100 µm.

Various embodiments provide a method for manufacturing a chip package, which may potentially provide low, e.g. zero defects, void free contacts e.g. galvanic contacts including copper, instead of a high defect and void loaded solder contacts near the active chip areas.

Various embodiments provide a method for manufacturing a chip package, which may provide better heat spreading and avoid hot spots.

Various embodiments provide a method for manufacturing a chip package, which includes pick and place of thick chips, e.g. chips thicker than 100 µm, at room temp with higher accuracy and speed.

Various embodiments provide a method for manufacturing a chip package, which uses an edge, e.g. plastic edge of an encapsulation material to stabilise a wafer level package which may include a panel which may be too thin to be held without excessive bending and/or deflection.

Various embodiments provide a method for manufacturing a chip package, which uses an edge, e.g. a thicker plastic edge, of a wafer level package to stabilise a wafer level package which may include a panel which may be too thin to be held without excessive bending and/or deflection.

Various embodiments provide a method for manufacturing a chip package, which uses an inner region of a wafer level package, e.g. a thicker inner structure, of a wafer level package to stabilise a wafer level package which may include a panel which may be too thin to be held without excessive bending and/or deflection.

Various embodiments provide a method for manufacturing a chip package, wherein ultra thin chips, e g. chips having thickness ranging from about 30 µm to 40 µm may be separated when already in a housing, e.g. an encapsulation material, therefore increasing robustness and yield.

Various embodiments provide a method for manufacturing a chip package, wherein double sided processing (e.g. metallization) may be used, for exposing both sides of a wafer level package to processing before and/or after thinning.

Various embodiments provide a method for manufacturing a chip package, the method including: arranging a plurality of dies over a carrier; depositing encapsulation material over the carrier wherein the plurality of dies are covered by the encapsulation material thereby forming a structure including the encapsulation material and the plurality of dies; and removing encapsulation material thereby forming a thinned portion of the structure and a further portion of the structure including encapsulation material thicker than the thinned portion.

According to an embodiment, arranging the plurality of dies over the carrier includes arranging the plurality of dies over the carrier wherein at least a portion of the plurality of dies are arranged with their front sides over the carrier.

According to an embodiment, arranging the plurality of dies over the carrier includes arranging the plurality of dies over the carrier wherein at least a portion of the plurality of dies are arranged with their back sides over the carrier.

According to an embodiment, the method further includes arranging a plurality of electrically conductive blocks over the carrier, wherein at least one die of the plurality of dies is arranged adjacent to at least one electrically conductive block of the plurality of electrically conductive blocks.

According to an embodiment, the method further includes depositing the encapsulation material wherein the plurality of electrically conductive blocks are covered by the encapsulation material, thereby forming a structure including the encapsulation material, the plurality of dies and the plurality of electrically conductive blocks.

According to an embodiment, the method further includes releasing the structure from the carrier; and depositing an electrically insulating layer and an electrically conductive material over a side of the plurality of dies, wherein the electrically conductive material contacts at least one die from the plurality of dies.

According to an embodiment, the method further includes releasing the structure from the carrier; depositing an electrically insulating layer over a side of the plurality of dies; forming one or more through-holes in the electrically insulating layer over the side of at least one die from the plurality of dies; and depositing electrically conductive material over the electrically insulating layer and in the one or more through-holes, wherein the electrically conductive material electrically contacts the at least one die.

According to an embodiment, depositing electrically conductive material over the electrically insulating layer and in the one or more through-holes, wherein the electrically conductive material electrically contacts the at least one die from the plurality of dies includes depositing electrically conductive material over the electrically insulating layer and in the one or more through-holes, wherein the electrically conductive material electrically contacts one or more electrical pads formed over the front side of the at least one die.

According to an embodiment, the method further includes selectively removing one or more portions of the electrically conductive material.

According to an embodiment, depositing an electrically insulating layer and an electrically conductive material over a side of the plurality of dies, wherein the electrically conductive material contacts at least one die from the plurality of dies includes depositing an electrically insulating layer and an electrically conductive material over a side of the plurality of dies, wherein the electrically conductive material contacts at least one die from the plurality of dies and at least one electrically conductive block.

According to an embodiment, depositing encapsulation material includes depositing an encapsulation material including at least one material from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

According to an embodiment, depositing encapsulation material includes depositing encapsulation material over one or more sidewalls of the plurality of dies and between the plurality of dies.

According to an embodiment, depositing the encapsulation material includes depositing encapsulation material between the at least one die and the at least one electrically conductive block.

According to an embodiment, removing encapsulation material thereby forming a thinned portion of the structure and a further portion of the structure including encapsulation material thicker than the thinned portion includes thinning the encapsulation material and a portion of the dies from a side of the structure opposite to sides of the plurality of dies arranged over the carrier.

According to an embodiment, removing encapsulation material thereby forming a thinned portion of the structure and a further portion of the structure including encapsulation material thicker than the thinned portion includes thinning the encapsulation material and a portion of the dies from a side of the structure opposite to sides of the plurality of dies arranged over the carrier thereby forming a thinned portion of the structure, the thinned portion of the structure having a thickness ranging from about 10 μm to about 300 μm.

According to an embodiment, removing encapsulation material thereby forming a thinned portion of the structure and a further portion of the structure including encapsulation material thicker than the thinned portion includes removing encapsulation material from a side of the structure using at least one of the processes from the following group of processes, the group consisting of: grinding, mechanical grinding, chemical removal, chemical etching, plasma etching, removal by laser.

According to an embodiment, removing encapsulation material thereby forming a thinned portion of the structure and a further portion of the structure including encapsulation material thicker than the thinned portion includes thinning the encapsulation material and the plurality of dies thereby forming a thinned cavity portion in the structure.

According to an embodiment, the method further includes removing encapsulation material thereby forming a thinned portion of the structure and a further portion of the structure including encapsulation material thicker than the thinned portion includes thinning the encapsulation material and a portion of the dies from a side of the structure opposite to sides of the plurality of dies arranged over the carrier thereby forming a thinned portion and a further portion of the structure including encapsulation material thicker than the thinned portion, the further portion substantially bordering the thinned portion.

According to an embodiment, removing encapsulation material thereby forming a thinned portion of the structure and a further portion of the structure including encapsulation material thicker than the thinned portion includes thinning the encapsulation material and a portion of the dies from a side of the structure opposite to sides of the plurality of dies arranged over the carrier thereby forming a thinned inner portion and a further outer portion thicker than the thinned inner portion of the structure.

According to an embodiment, removing encapsulation material thereby forming a thinned portion of the structure and a further portion of the structure including encapsulation material thicker than the thinned portion includes thinning the encapsulation material and one or more dies from a side of the structure opposite to sides of the one or more dies arranged over the carrier thereby forming a thinned outer portion and a further inner portion thicker than the thinned outer portion of the structure.

According to an embodiment, depositing an electrically conductive layer over the thinned portion of the structure, the electrically conductive layer electrically contacting back sides of the plurality of dies.

According to an embodiment, depositing an electrically conductive layer over the thinned portion of the structure, includes depositing an electrically conductive layer over the thinned portion of the structure, the electrically conductive layer including at least one from the following group of materials, the group of materials consisting of: copper, aluminum, silver, tin, gold, palladium, zinc, nickel, iron, tungsten, molybdenum, tantalum, titanium, vanadium.

According to an embodiment, the method further includes further including depositing an electrically conductive layer over the thinned portion of the structure, the electrically conductive layer electrically connecting a side of the at least one die to the at least one electrically conductive block.

According to an embodiment, the method further includes depositing an electrically conductive layer over the thinned portion of the structure of the cavity portion.

According to an embodiment, the method depositing an electrically conductive layer over the thinned portion of the structure, includes depositing an electrically conductive layer by at least one process from the following group of processes, the group consisting of: galvanic deposition, electroplating, plasma deposition, particles deposition, soldering, electrolytic deposition, chemical deposition, chemical vapor deposition, plasma enhanced chemical vapor deposition.

According to an embodiment, the method further includes selectively removing one or more portions of the electrically conductive layer from the thinned portion of the structure; separating the die through the encapsulation material.

According to an embodiment, the method further includes depositing electrically conductive material over at least one side of the structure, wherein the electrically conductive material is thicker than the thinned portion of the structure.

Various embodiments provide a method for manufacturing a chip package, the method including: arranging a plurality of dies over a carrier; depositing encapsulation material over the carrier wherein the plurality of dies are covered by the encapsulation material thereby forming a structure including the encapsulation material and the plurality of dies; and forming one or more electrical interconnects over a first side of the plurality of dies before thinning the encapsulation material and the plurality of dies from a second side of the structure opposite to the first side of the plurality of dies.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a chip package, the method comprising: arranging a plurality of dies over a carrier, the plurality of dies having a top and bottom side opposite thereto; arranging a plurality of electrically conductive blocks over the carrier, the plurality of blocks having a top and bottom side opposite thereto; depositing encapsulation material over the carrier wherein the plurality of dies are covered by the encapsulation material thereby forming a structure comprising the encapsulation material and the plurality of dies; removing encapsulation material opposite the carrier exposing at least a portion of the bottom side of at least one die from the plurality of dies and at least one block of the plurality of electrically conductive blocks, thereby forming a thinned portion of the structure and a further portion of the structure comprising encapsulation material thicker than the thinned portion; wherein the thinned portion forms a recess bounded by the further portion; and wherein the bottom side of the at least one die and at least one block have a substantially equal height from the carrier, further comprising depositing electrically conductive material over at least one side of the structure, wherein the electrically conductive material is thicker than the thinned portion of the structure and overlaps the thinned portion and the further portion; and wherein each of the thinned portion and the further portion comprises one or more dies.

2. The method according to claim 1, wherein arranging the plurality of dies over the carrier comprises arranging the plurality of dies over the carrier wherein at least a portion of the plurality of dies are arranged with their front sides over the carrier.

3. The method according to claim 1, wherein arranging the plurality of dies over the carrier comprises arranging the plurality of dies over the carrier wherein at least a portion of the plurality of dies are arranged with their backsides over the carrier.

4. The method according to claim 1, wherein at least one die of the plurality of dies is arranged adjacent to the at least one electrically conductive block of the plurality of electrically conductive blocks.

5. The method according to claim 4, further comprising depositing the encapsulation material wherein the plurality of electrically conductive blocks are covered by the encapsulation material, thereby forming a structure comprising the encapsulation material, the plurality of dies and the plurality of electrically conductive blocks.

6. The method according to claim 1, further comprising releasing the structure from the carrier; and
depositing an electrically insulating layer and an electrically conductive material over a side of the plurality of dies, wherein the electrically conductive material contacts at least one die from the plurality of dies.

7. The method according to claim 1, further comprising releasing the structure from the carrier;
depositing an electrically insulating layer over a side of the plurality of dies;
forming one or more through-holes in the electrically insulating layer over the side of at least one die from the plurality of dies; and
depositing electrically conductive material over the electrically insulating layer and in the one or more through-holes, wherein the electrically conductive material electrically contacts the at least one die.

8. The method according to claim 7, wherein depositing electrically conductive material over the electrically insulating layer and in the one or more through-holes, wherein the electrically conductive material electrically contacts the at least one die from the plurality of dies comprises depositing electrically conductive material over the electrically insulating layer and in the one or more through-holes, wherein the electrically conductive material electrically contacts one or more electrical pads formed over the front side of the at least one die.

9. The method according to claim 7, further comprising selectively removing one or more portions of the electrically conductive material.

10. The method according to claim 7, wherein depositing an electrically insulating layer and an electrically conductive material over a side of the plurality of dies, wherein the electrically conductive material contacts at least one die from the plurality of dies comprises depositing an electrically insulating layer and an electrically conductive material over a side of the plurality of dies, wherein the electrically conductive material contacts at least one die from the plurality of dies and at least one electrically conductive block.

11. The method according to claim 1, wherein depositing encapsulation material comprises depositing an encapsulation material comprising at least one material from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

12. The method according to claim 1, wherein depositing encapsulation material comprises depositing encapsulation material over one or more sidewalls of the plurality of dies and between the plurality of dies.

13. The method according to claim 4, wherein depositing the encapsulation material comprises depositing encapsulation material between the at least one die and the at least one electrically conductive block.

14. The method according to claim 1, wherein removing encapsulation material thereby forming a thinned portion of the structure and a further portion of the structure comprising encapsulation material thicker than the thinned portion comprises thinning the encapsulation material and a portion of the dies from a side of the structure opposite to sides of the plurality of dies arranged over the carrier.

15. The method according to claim 1, wherein removing encapsulation material thereby forming a thinned portion of the structure and a further portion of the structure comprising encapsulation material thicker than the thinned portion comprises thinning the encapsulation material and a portion of the dies from a side of the structure opposite to sides of the plurality of dies arranged over the carrier thereby forming a thinned portion of the structure, the thinned portion of the structure having a thickness ranging from about 10 µm to about 300 µm.

16. The method according to claim 1, wherein removing encapsulation material thereby forming a thinned portion of the structure and a further portion of the structure comprising encapsulation material thicker than the thinned portion comprises removing encapsulation material from a side of the structure using at least one of the processes from the following group of processes, the group consisting of: grinding, mechanical grinding, chemical removal, chemical etching, plasma etching, removal by laser.

17. The method according to claim 1, wherein removing encapsulation material thereby forming a thinned portion of the structure and a further portion of the structure comprising encapsulation material thicker than the thinned portion comprises thinning the encapsulation material and the plurality of dies thereby forming a thinned cavity portion in the structure.

18. The method according to claim 1, wherein removing encapsulation material thereby forming a thinned portion of the structure and a further portion of the structure comprising encapsulation material thicker than the thinned portion comprises thinning the encapsulation material and a portion of the dies from a side of the structure opposite to sides of the plurality of dies arranged over the carrier thereby forming a thinned portion and a further portion of the structure comprising encapsulation material thicker than the thinned portion, the further portion substantially bordering the thinned portion.

19. The method according to claim 1, wherein removing encapsulation material thereby forming a thinned portion of the structure and a further portion of the structure comprising encapsulation material thicker than the thinned portion comprises thinning the encapsulation material and a portion of the dies from a side of the structure opposite to sides of the plurality of dies arranged over the carrier thereby forming a thinned inner portion and a further outer portion thicker than the thinned inner portion of the structure.

20. The method according to claim 1, wherein removing encapsulation material thereby forming a thinned portion of the structure and a further portion of the structure comprising encapsulation material thicker than the thinned portion comprises thinning the encapsulation material and one or more dies from a side of the structure opposite to sides of the one or more dies arranged over the carrier thereby forming a thinned outer portion and a further inner portion thicker than the thinned outer portion of the structure.

21. The method according to claim 1, further comprising depositing an electrically conductive layer over the thinned portion of the structure, the electrically conductive layer electrically contacting backsides of the plurality of dies.

22. The method according to claim 21, wherein depositing an electrically conductive layer over the thinned portion of the structure, comprises depositing an electrically conductive layer over the thinned portion of the structure, the electrically conductive layer comprising at least one from the following group of materials, the group of materials consisting of: copper, aluminum, silver, tin, gold, palladium, zinc, nickel, iron, tungsten, molybdenum, tantalum, titanium, vanadium.

23. The method according to claim 4, further comprising depositing an electrically conductive layer over the thinned portion of the structure, the electrically conductive layer electrically connecting a side of the at least one die to the at least one electrically conductive block.

24. The method according to claim 17, further comprising depositing an electrically conductive layer over the thinned portion of the structure of the cavity portion.

25. The method according to claim 21, wherein depositing an electrically conductive layer over the thinned portion of the structure, comprises depositing an electrically conductive layer by at least one process from the following group of processes, the group consisting of: galvanic deposition, electroplating, plasma deposition, particles deposition, soldering, electrolytic deposition, chemical deposition, chemical vapor deposition, plasma enhanced chemical vapor deposition.

26. The method according to claim 21, further comprising selectively removing one or more portions of the electrically conductive layer from the thinned portion of the structure; separating the die through the encapsulation material.

27. A method for manufacturing a chip package, the method comprising: arranging a plurality of dies over a carrier, the plurality of dies having a first and second side opposite thereto; arranging a plurality of electrically conductive blocks over the carrier, the plurality of blocks having a first and second side opposite thereto; depositing encapsulation material over the carrier wherein the plurality of dies are covered by the encapsulation material thereby forming a structure comprising the encapsulation material and the plurality of dies; forming one or more electrical interconnects over the first side of the plurality of dies before thinning the encapsulation material and the plurality of dies from a second side of the structure opposite to the first side of the plurality of dies; portion exposes at least a portion of the bottom side of at least one die from the plurality of dies and at least one block of the plurality of electrically conductive blocks; and wherein the thinned encapsulation material forms a recess bounded by a further portion which is thicker than the thinned portion; and wherein the second side of the at least one die and at least one block have a substantially equal height from the carrier, further comprising depositing electrically conductive material over at least one side of the structure, wherein the electrically conductive material is thicker than the thinned portion of the structure and overlaps the thinned portion and the further portion; and wherein each of the thinned portion and the further portion comprises one or more dies.

* * * * *